US012575196B2

(12) United States Patent
Jones et al.

(10) Patent No.: US 12,575,196 B2
(45) Date of Patent: Mar. 10, 2026

(54) MID-INFRARED AVALANCHE PHOTODIODES WITH LOW DARK CURRENTS

(71) Applicant: University of Virginia Patent Foundation, Charlottesville, VA (US)

(72) Inventors: Andrew H. Jones, Charlottesville, VA (US); Joe C. Campbell, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 373 days.

(21) Appl. No.: 18/210,767

(22) Filed: Jun. 16, 2023

(65) Prior Publication Data

US 2024/0170601 A1     May 23, 2024

Related U.S. Application Data

(60) Provisional application No. 63/353,071, filed on Jun. 17, 2022.

(51) Int. Cl.
H10F 30/225 (2025.01)
H10F 77/124 (2025.01)

(52) U.S. Cl.
CPC ..... H10F 30/2255 (2025.01); H10F 77/1248 (2025.01)

(58) Field of Classification Search
CPC .......................... H10F 30/2255; H10F 77/1248
See application file for complete search history.

(56) References Cited

U.S. PATENT DOCUMENTS

| | | | |
|---|---|---|---|
| 10,032,950 B2 | 7/2018 | Campbell et al. | |
| 2017/0244002 A1* | 8/2017 | Campbell | H10F 30/2255 |
| 2021/0249545 A1* | 8/2021 | Roucka | H10F 30/2255 |
| 2022/0416110 A1* | 12/2022 | Tan | H10F 30/2255 |

OTHER PUBLICATIONS

"AlxIn1-xAsySb1-6 Digital Alloy Avalanche Photodiodes for Low-Noise Applications," Dissertation presented to the School of Engineering and Applied Science, University of Virginia by Andrew H. Jones dated May 2020.

Jones et al. (2020) "Low-noise high-temperature ALLnAsSb/GaSb avalanche photodiodes for 2- um applications," Nature Photonics, vol. 14, pp. 559-563.

Jones et al. (2022) "AllnAsSb Separate Absorption, Charge, and Multiplication Avalanche Photodiodes for Mid-Infrared Detection," IEEE Journal of Quantum Electronics, vol. 58, No. 4, pp. 1-6 (DOI: 10.1109/JQE.2022.3149532).

* cited by examiner

*Primary Examiner* — Matthew L Reames
(74) *Attorney, Agent, or Firm* — Jenkins, Taylor & Hunt, P.A.

(57) ABSTRACT

Avalanche photodiode designs having separate absorption and multiplication regions are disclosed. The avalanche photodiode designs include a charge layer tailored to allow charge carrier transport from the absorption layer to the multiplication layer and reduce the dark current when the avalanche photodiode is reverse biased.

28 Claims, 13 Drawing Sheets

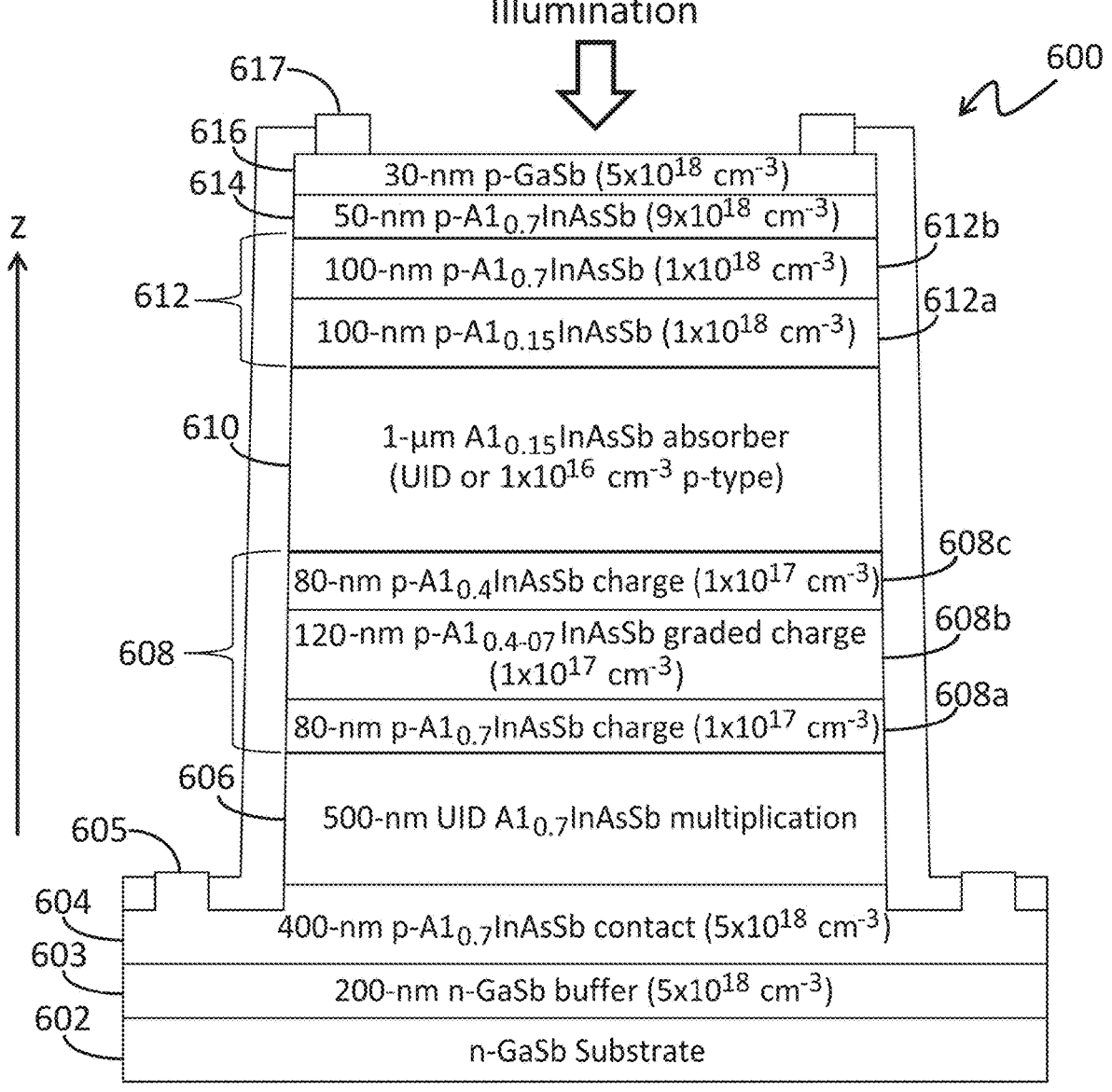

Illumination

617

600

616

614

30-nm p-GaSb ($5 \times 10^{18}$ cm$^{-3}$)

50-nm p-Al$_{0.7}$InAsSb ($9 \times 10^{18}$ cm$^{-3}$)     612b 612     100-nm p-Al$_{0.7}$InAsSb ($1 \times 10^{18}$ cm$^{-3}$)

100-nm p-Al$_{0.15}$InAsSb ($1 \times 10^{18}$ cm$^{-3}$)     612a 610     1-μm Al$_{0.15}$InAsSb absorber
(UID or $1 \times 10^{16}$ cm$^{-3}$ p-type)

608c 80-nm p-Al$_{0.4}$InAsSb charge ($1 \times 10^{17}$ cm$^{-3}$)

608     120-nm p-Al$_{0.4-07}$InAsSb graded charge
($1 \times 10^{17}$ cm$^{-3}$)     608b 80-nm p-Al$_{0.7}$InAsSb charge ($1 \times 10^{17}$ cm$^{-3}$)     608a 606     500-nm UID Al$_{0.7}$InAsSb multiplication

605

604

603     400-nm p-Al$_{0.7}$InAsSb contact ($5 \times 10^{18}$ cm$^{-3}$)

200-nm n-GaSb buffer ($5 \times 10^{18}$ cm$^{-3}$)

602     n-GaSb Substrate z

FIG. 6

MID-INFRARED AVALANCHE PHOTODIODES WITH LOW DARK CURRENTS

CROSS-REFERENCE TO RELATED APPLICATIONS

This application claims benefit of U.S. Provisional Application Ser. No. 63/353,071 filed on Jun. 17, 2022, the disclosure of which is incorporated herein by reference in its entirety.

STATEMENT REGARDING FEDERALLY SPONSORED R&D

This invention was made with U.S. Government support under Contract No. W911NF-16-2-0178, awarded by the Department of Defense. The Government has certain rights in the invention.

BACKGROUND

Field

The present disclosure relates to semiconductor optical detectors and to avalanche photodiodes having an absorption region, a charge region, and a multiplication region.

Description of the Related Art

Avalanche photodiodes (APDs) are photodetectors that can provide higher sensitivities compared to conventional PIN photodiodes using an intrinsic gain mechanism. APDs are widely deployed in scientific, telecommunication, and military applications where an optical system should detect and process very low optical intensities. The growing interest in optical systems, such as gas sensors/analyzers and light detection and ranging (LIDAR) systems operating in the mid infrared (mid-IR) spectral range has triggered significant effort toward developing high sensitivity mid-IR APDs. Additionally, the development of quantum computation and quantum communication systems has pushed the demand for high sensitivity photodetection to the single-photon level and led to new challenges in APD design.

SUMMARY

The emergence of various optical technologies that operate in the mid infrared (mid-IR) spectral range and rely on high sensitivity mid-IR photodetection has led to new challenges for designing high sensitivity mid-IR APD photodetectors. In general, given the inherent relation between noise and intrinsic gain in an APD, providing high gain and low noise can be a major design challenge for these devices. In particular, sensitivity of an APD can be limited by generation of dark electric current (referred to as dark current) that contributes to the total noise and reduces the signal-to-noise ratio (SNR) of the APD. As such, there is a need for new design strategies that may reduce the dark current generated by APDs operating in the mid-IR spectral range without reducing their internal gain.

An aspect of the APD designs disclosed below provides, among other things, an APD having separate absorption, charge, and multiplication layers (a SACM APD), that generates a lower level of dark current that conventional SACM APDs and may operate at higher temperatures.

In another aspect, an embodiment of the disclosed APD design comprises a multiplication layer, a charge layer, and an absorption layer where the specific structure and composition of the charge and the absorption layer introduces a potential barrier between the charge and the absorption layer. The potential barrier may be tailored to reduce generation of dark current without significant impact on charge carrier (e.g., photogenerated electrons) transport from the absorption layer to the multiplication layer, when the APD is reverse biased to provide a specified internal gain.

In another aspect, an embodiment of the disclosed APD design comprises a multiplication layer, a charge layer, and an absorption layer where the charge layer comprises multiple sublayers including an interfacial sublayer having an interface with the absorption layer. The thickness of the interfacial sublayer and its composition compared to the composition of the absorption layer is tailored to provide a potential barrier between the charge and the absorption layer such when the APD is reverse biased, the potential barrier limits recombination of the charge carriers while allowing them to move from the absorption layer to the multiplication layer.

In another aspect, an embodiment of the disclosed designs provides an APD that detects and amplifies light having a wavelength in the mid-IR spectral range and generates a dark current that is small enough to allow single photon detection and/or photon counting. The dark current reduction mechanism provided by the disclosed APD designs allows operation of the corresponding APDs at temperatures well above 200 K (degrees Kelvin or Kelvin).

In another aspect, an embodiment of the disclosed APD design comprises separate multiplication, charge, and absorption layers, each comprising AlInAsSb, where the charge layer comprises multiple sublayers, each including an interfacial sublayer having an interface with the absorption layer. The interfacial sublayer can have an energy bandgap greater than that of the absorption layer by at least a factor of 1.2.

In another aspect, an avalanche photodiode (APD) is configured to allow generation and amplification of a photocurrent upon receiving light while limiting the generation of a dark current where the light comprises incident photons having wavelengths within an operating wavelength range of the APD. The APD can include an absorption layer configured to absorb the incident photons, the absorption layer comprising a first semiconductor material having a first energy bandgap, a multiplication layer configured to allow multiplication of charge carriers generated in the absorption layer, the multiplication layer comprising a second semiconductor material having a second energy bandgap, and a charge layer disposed between the multiplication layer and the absorption layer. The charge layer can include a first interfacial charge sublayer adjacent to the absorption layer. The first interfacial charge sublayer has a first thickness and can include a third semiconductor material having a third energy bandgap. An intermediate charge sublayer can be adjacent to the first interfacial charge sublayer and opposite to the absorption layer. The intermediate charge sublayer has a second thickness and comprises a fourth semiconductor material having a fourth energy bandgap. The third energy bandgap can be greater than the first energy bandgap by a factor greater than 1.2, at least at an interface between the first interfacial charge sublayer and the absorption layer. The first, second, and third thicknesses can be from 10 nm to 200 nm. The operating wavelength range can be from 2 microns to 6 microns. The fourth energy bandgap can be graded along the second thickness at least within a portion of the second thickens. In some cases, the first, second, third, fourth, and fifth semiconductor materials can include p-type AlInAsSb. The APD can operate at temperatures greater than 200 K.

In another aspect, an avalanche photodiode (APD) is configured to allow generation and amplification of a photocurrent upon receiving light while limiting the generation of a dark current. The received light comprises incident photons having wavelengths within an operating wavelength range of the APD. The APD can include an absorption layer configured to absorb the incident photons, the absorption layer comprising a semiconductor material having a composition comprising $A_zB_{1-z}$; a multiplication layer configured to allow multiplication of charge carriers generated in the absorption layer; and a charge layer extended from the multiplication layer to the absorption layer. The charge layer comprises: a first interfacial charge sublayer adjacent to the absorption layer, the first interfacial charge sublayer having a first thickness and comprising a semiconductor material having a composition comprising $A_wB_{1-w}$; an intermediate charge sublayer adjacent to the first interfacial charge sublayer opposite to the absorption layer, the intermediate charge sublayer having a second thickness and comprising a semiconductor material having a composition comprising $A_yB_{1-y}$, and wherein the absolute value of difference between w and z is greater than 0.1. The first and the second thicknesses can be from 10 nm to 200 nm.

In another aspect, an avalanche photodiode (APD) is configured to generate a photocurrent upon receiving light having a wavelength in a mid-IR spectral range, the avalanche photodiode comprising: a multiplication layer comprising AlInAsSb; a charge layer comprising: a first charge sublayer adjacent to the multiplication layer; a second charge sublayer adjacent to the first charge sublayer opposite to the multiplication layer; a third charge sublayer adjacent to the second charge sublayer; an absorption layer adjacent to the third charge sublayer, opposite to the second charge sublayer, wherein the absorption layer comprises AlInAsSb; wherein the first, second, and third charge sublayers comprise AlInAsSb, each charge sublayer having a different stoichiometric ratio between Al and In; and wherein at least one layer characteristic is different for the first, second, and third charge sublayers.

A device may include an absorption layer configured to absorb the incident photons, the absorption layer comprising a first semiconductor material having a first energy bandgap. A device may include a multiplication layer configured to allow multiplication of charge carriers generated in the absorption layer, the multiplication layer comprising a second semiconductor material having a second energy bandgap. A device may include a charge layer disposed between the multiplication layer and the absorption layer, wherein the charge layer comprises: a first interfacial charge sublayer adjacent to the absorption layer, the first interfacial charge sublayer having a first thickness and comprising a third semiconductor material having a third energy bandgap; and an intermediate charge sublayer adjacent to the first interfacial charge sublayer opposite to the absorption layer, the intermediate charge sublayer having a second thickness and comprising a fourth semiconductor material having a fourth energy bandgap, wherein the third energy bandgap is greater than the first energy bandgap by a factor greater than 1.2 at least at an interface between the first interfacial charge sublayer and the absorption layer.

Some embodiments provide a method of fabricating an avalanche photodiode (APD) configured to allow generation and amplification of a photocurrent upon receiving light while limiting the generation of a dark current, wherein the light comprises incident photons having wavelengths within an operating wavelength range of the APD. The method comprising: disposing a bottom contact layer above a substrate layer, disposing a multiplication layer above the bottom contact layer, where the multiplication layer comprises AlInAsSb. The method further comprise disposing a first charge sublayer having a first thickness on top of the multiplication layer, disposing a second charge sublayer having a second thickness on top of the first charge sublayer, disposing a third charge sublayer having a third thickness on top of the second charge sublayer, disposing an absorption layer on top of the third charge sublayer, where the absorption layer comprises AlInAsSb. At least one layer characteristic is different for the first, second, and third charge sublayer.

Examples of the APDs designed and fabricated based on the disclosed methods were reported in a scientific publication titled "AlInAsSb Separate Absorption, Charge, and Multiplication Avalanche Photodiodes for Mid-Infrared Detection" by A. H. Jones et al., published online on Feb. 7, 2022 in IEEE Journal of Quantum Electronics (DOI: 10.1109/JQE.2022.3149532), the entire contents of which are incorporated by reference herein and made a part of this specification. The reported APD in this publication includes AlInAsSb based SACM APDs avalanche photodiodes having cutoff wavelength of greater than 3 microns and operating at 240 K with an external quantum efficiency of 65% at 2 microns (without antireflection enhancement).

Example systems that may benefit from the improved performance of the APDs designed according to the disclosed designs and structures include light detection and ranging (LIDAR) systems, night vision systems, telescopes, gas sensors/analyzers, and quantum computation and quantum communication systems. In LIDAR systems that operate in mid-IR range (e.g., to reduce interference with background light), the disclosed APDs may improve the range and accuracy of the LIDAR and allow reducing the intensity of the corresponding laser beams resulting in lower power consumption and higher safety level (e.g., compared to those operating in shorter wavelengths). In night vision systems, the disclosed APDs may improve visibility range and contrast and thereby allow imaging smaller targets, targets at longer distances, or targets having lower temperatures.

BRIEF DESCRIPTION OF THE DRAWINGS

The systems, methods, and devices of this disclosure each have several innovative aspects, no single one of which is solely responsible for all of the desirable attributes disclosed herein. Details of one or more embodiments of the subject matter described in this specification are set forth in the accompanying drawings and the description below.

FIG. 4B schematically illustrates the energy band diagrams of two different SACM APD designs comprising the

5

Figure 2:
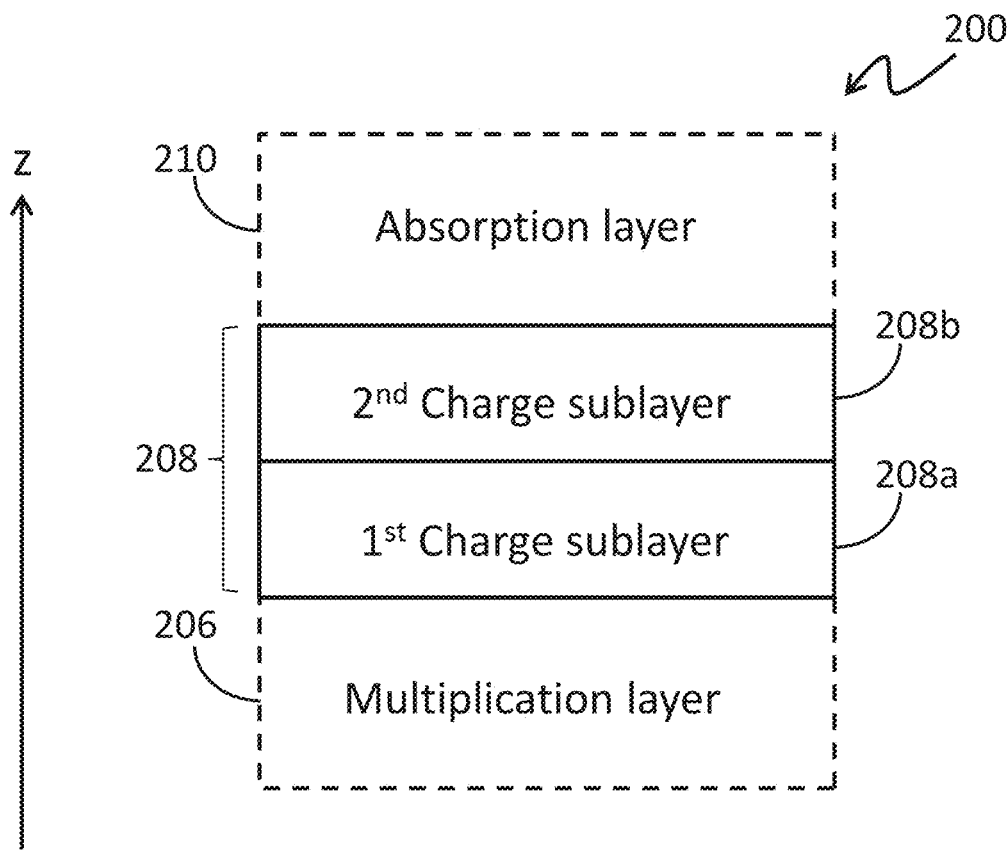
FIG. 2 schematically illustrates a cross section of a portion of the SACM APD shown in FIG. 1 that includes the charge, absorption and multiplication layers.
Figure 3:
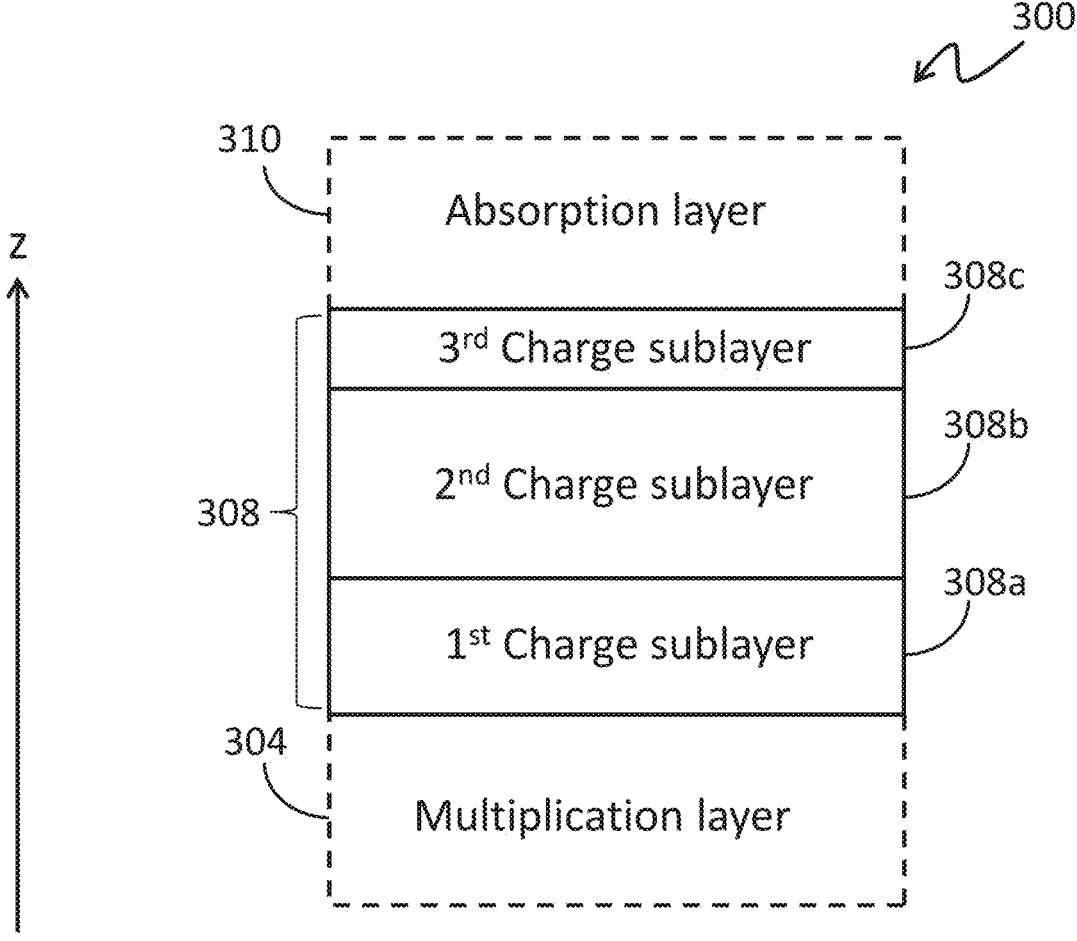
FIG. 3 schematically illustrates a cross section of the charge, absorption and multiplication layers of an SACM APD having reduced dark current.

6 layers shown in FIG. 2 (dashed line) and FIG. 3 (solid line), across the corresponding absorption, charge, and multiplication layers.

Figure 5:
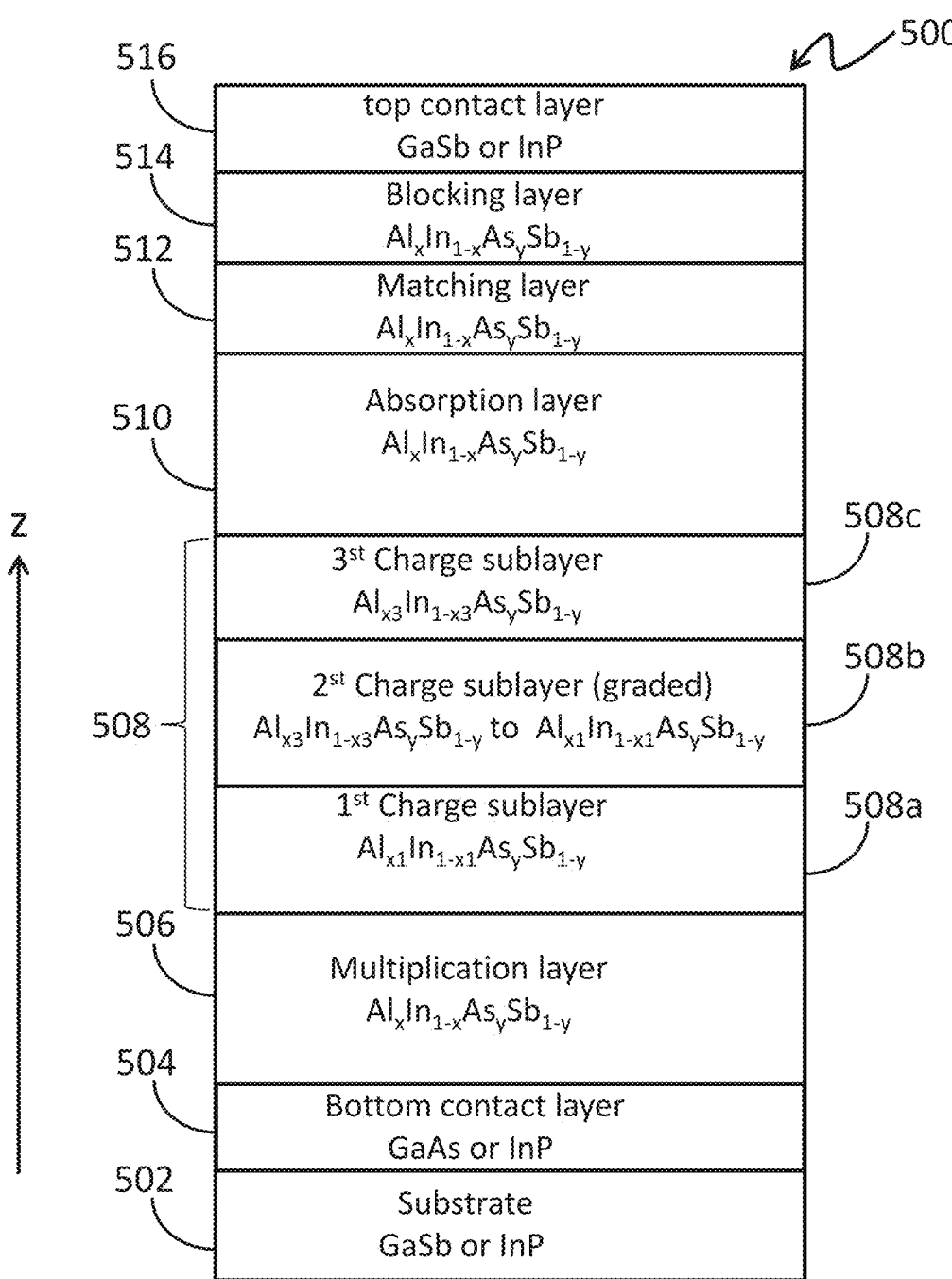

FIG. 5 illustrates a cross section of an embodiment of APD design according to the present disclosure.

FIG. 6 illustrates a cross section of another embodiment of APD design according to the present disclosure.

Figure 7A:
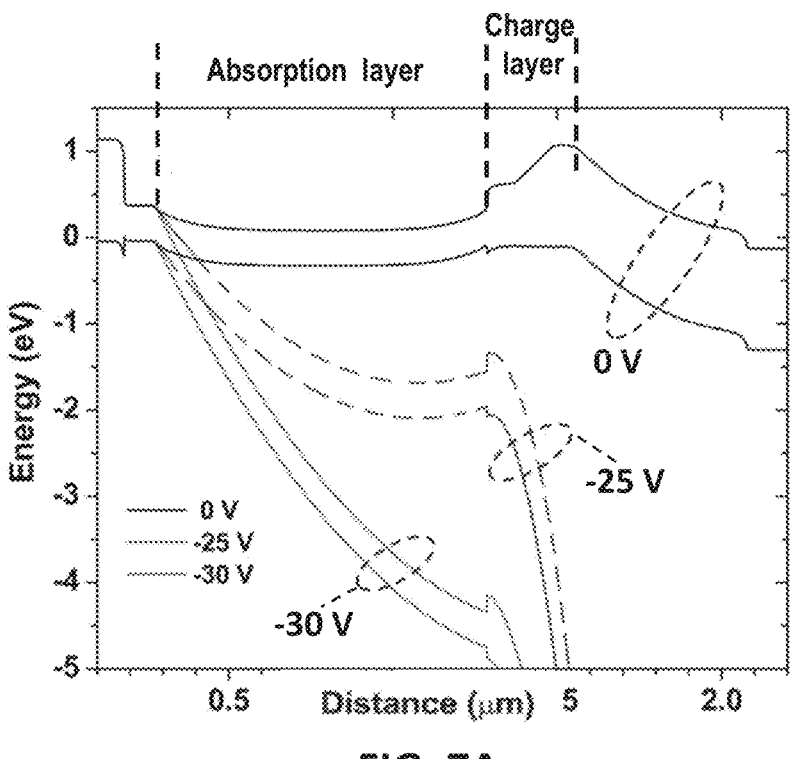

FIG. 7A illustrates the energy band diagrams of the APD design shown in FIG. 6 having an absorption layer comprising an unintentionally doped (UID) n-type AlInAsSb, simulated at three different reverse bias voltages.

Figure 7B:
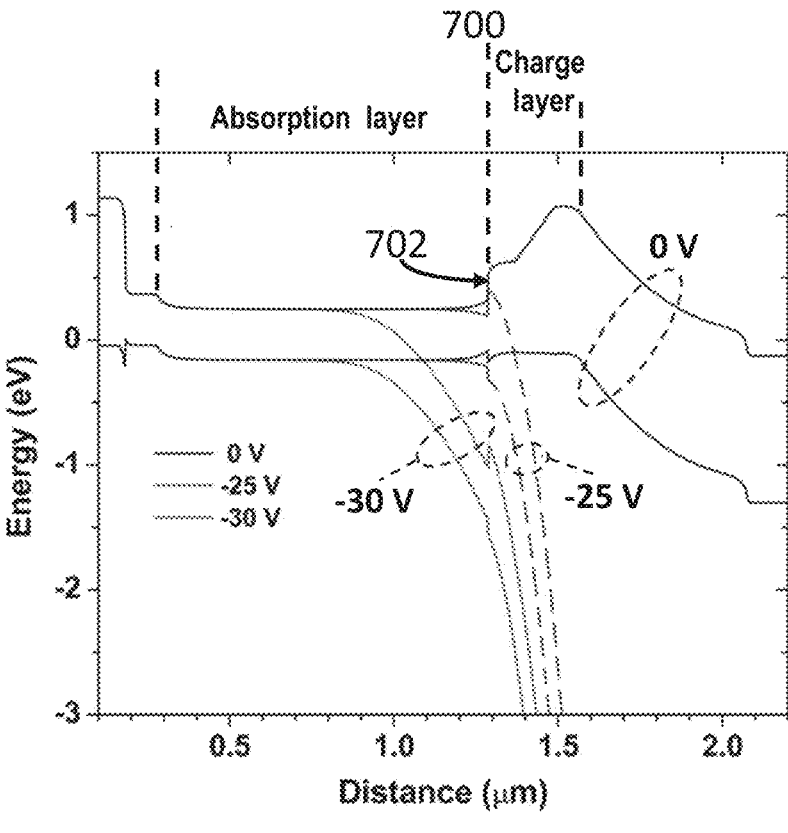

FIG. 7B illustrates the energy band diagrams of the APD design shown in FIG. 6 having an absorption layer comprising an intentionally doped p-type AlInAsSb, simulated at three different reverse bias voltages.

Figure 8:
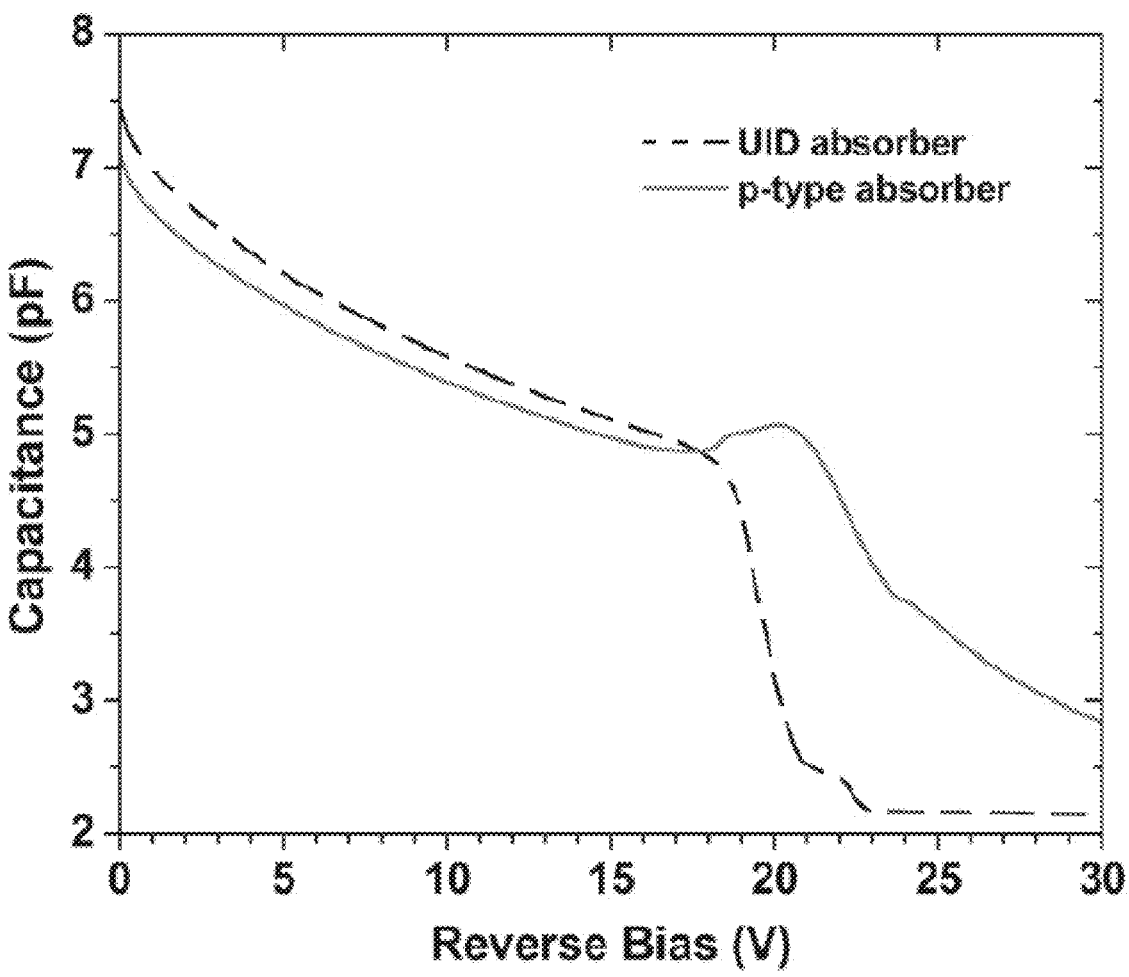

FIG. 8 Illustrates the capacitance as a function of reverse bias voltage for the APD design shown in FIG. 6 when the absorption layer comprises UID AlInAsSb (dashed line) and intentionally doped (p-compensated) AlInAsSb (solid line).

Figure 9A:
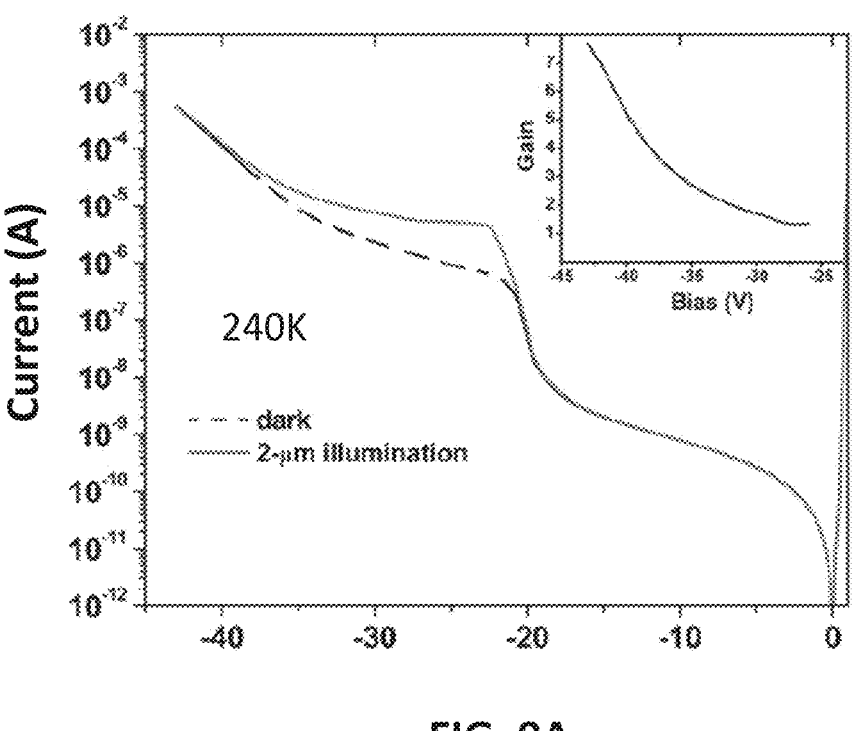
Figure 9B:
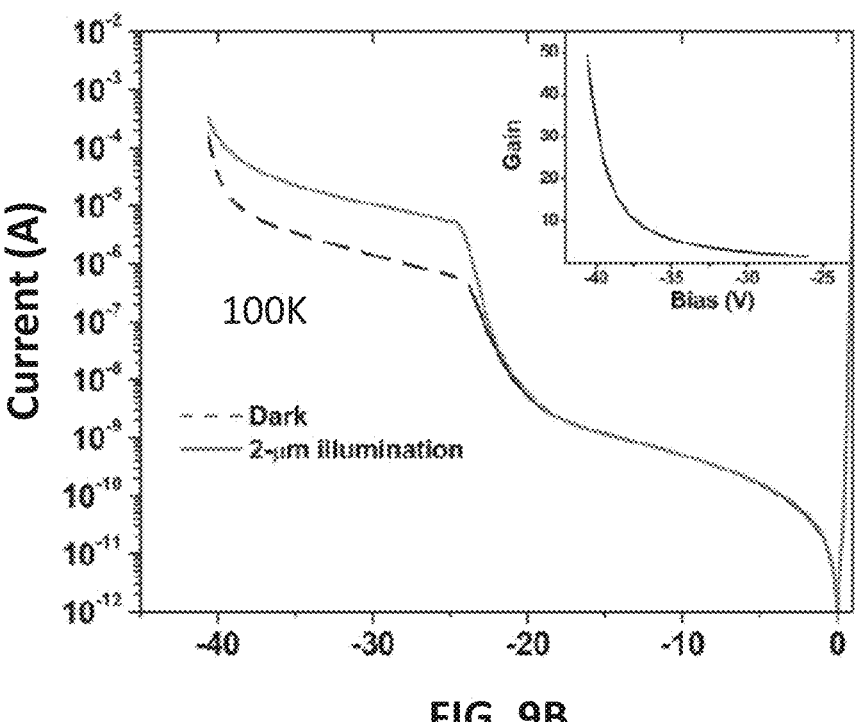

FIGS. 9A-9B illustrate the current-bias voltage and gain-bias voltage (insets) characteristics of the APD design shown in FIG. 6 having an UID absorption layer in the presence (solid line) and absence (dashed line) of illumination when the temperature of the device is (A) 240 K (degrees Kelvin or Kelvin), and (B) 100 K (degrees Kelvin or Kelvin).

Figure 9C:
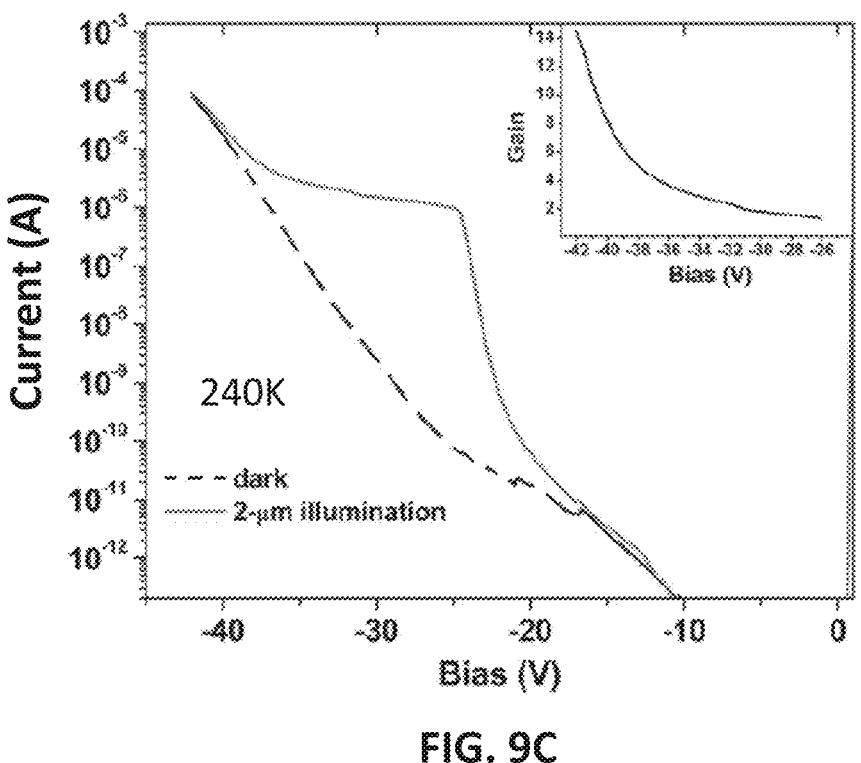
Figure 9D:
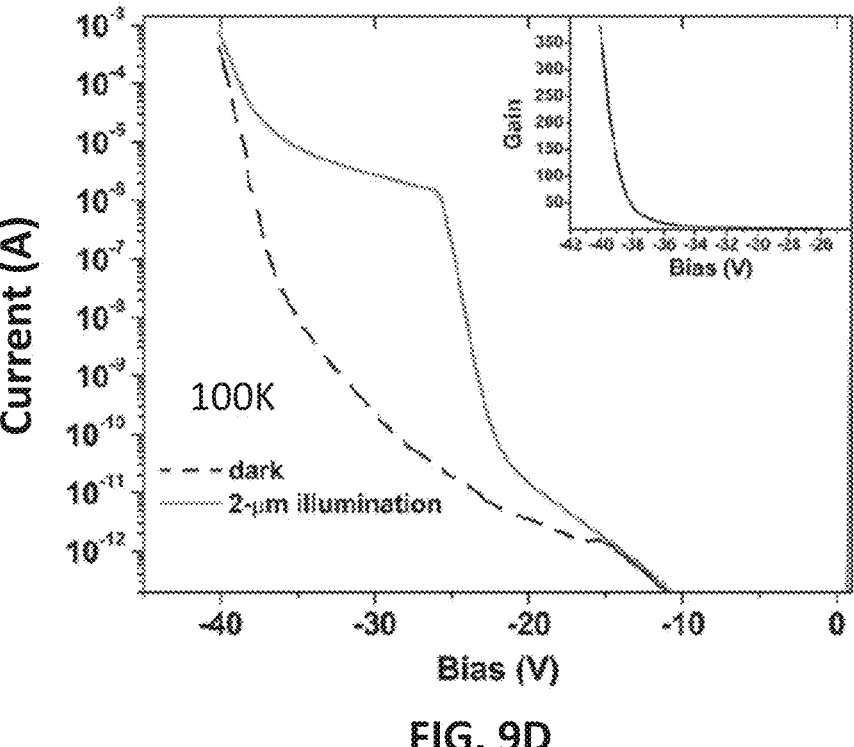

FIGS. 9C-9D illustrate the current-bias voltage and gain-bias voltage (insets) characteristics of the APD design shown in FIG. 6 having an intentionally doped p-compensated absorption layer in the presence (solid line) and absence (dashed line) of illumination when the temperature of the device is (C) 240 K and (D) 100K.

Figure 10:
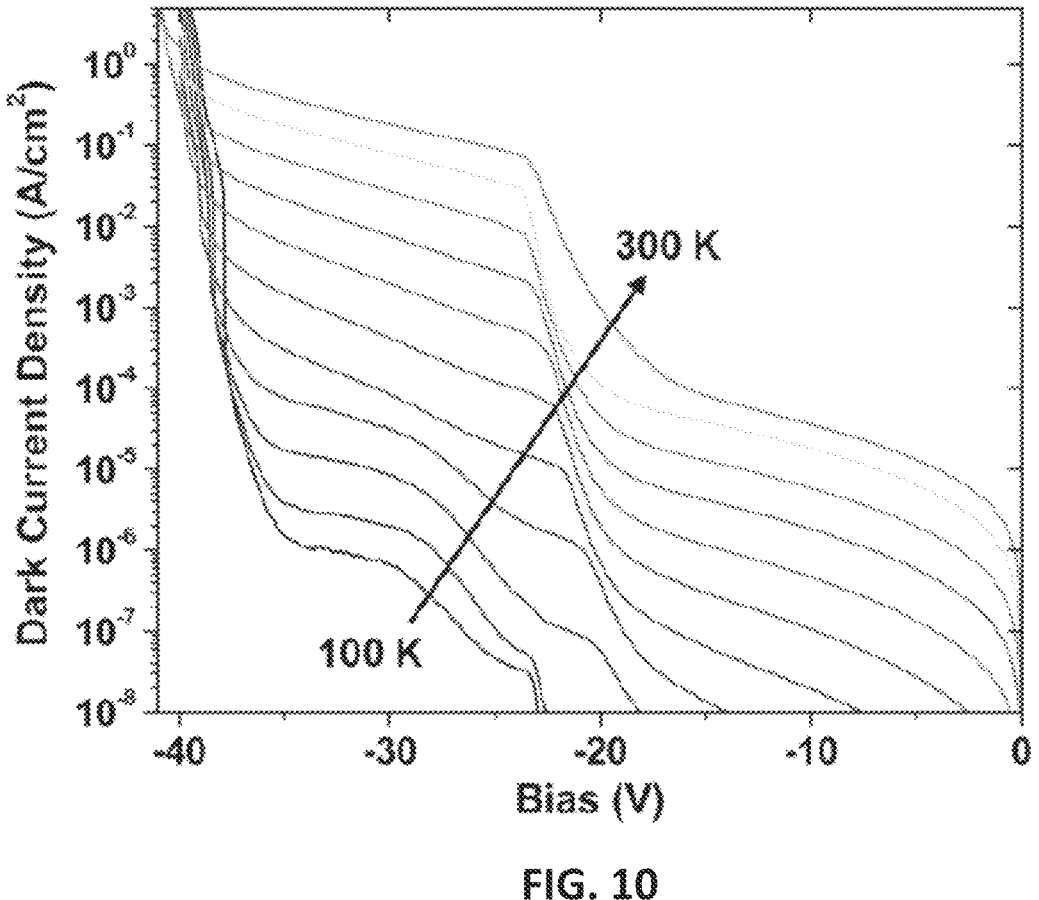

FIG. 10 illustrates the dark current density of the APD design shown in FIG. 6 having an intentionally doped p-compensated absorption layer plotted against bias voltage applied on the APD at different temperatures. Starting from an operating temperature of 100 K, each curve represents a 20-K increment up to 300 K as indicated.

Figure 11A:
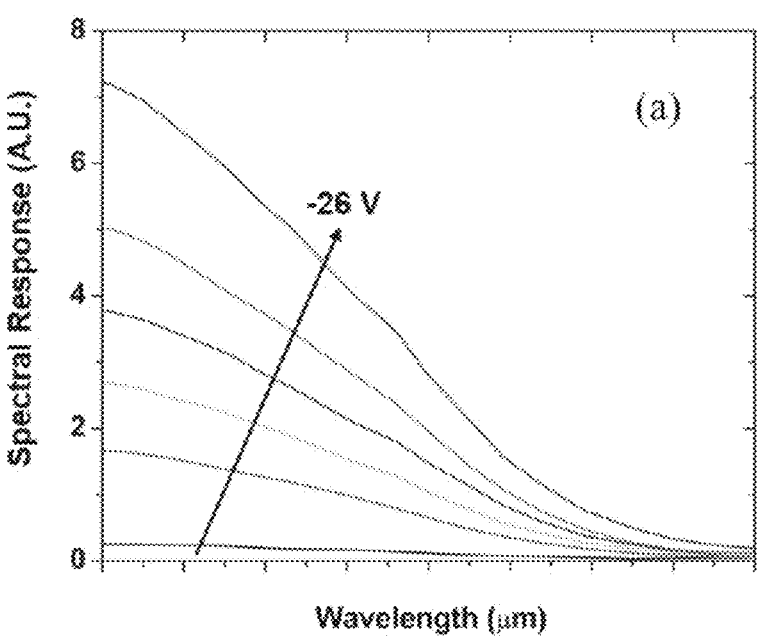
Figure 11B:
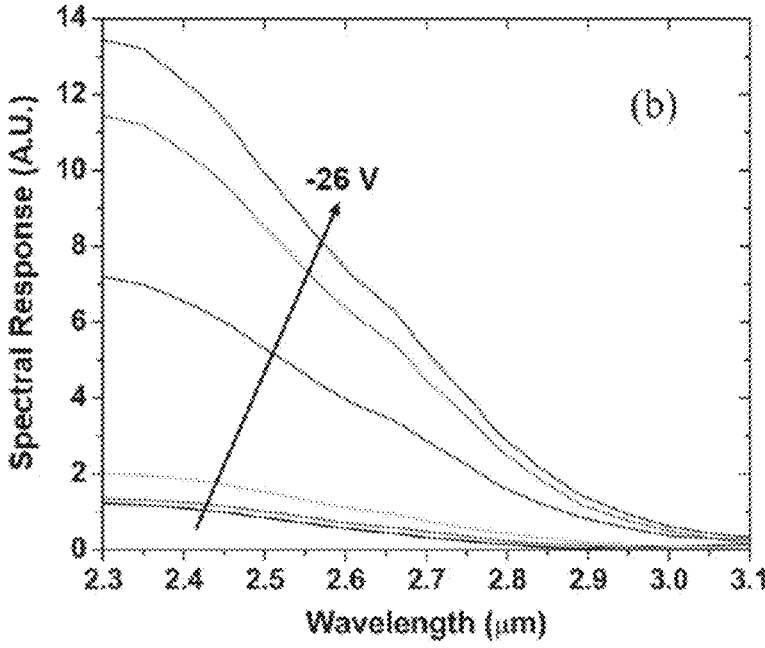

FIGS. 11A-11B illustrate the spectral response of the APD design shown in FIG. 6 having (A) an UID absorption layer, (B) an intentionally doped (p-compensated) absorption layer at 240 K and for several reverse bias voltages increasing from 21 to 26 V as indicated by the arrows.

Figure 12:
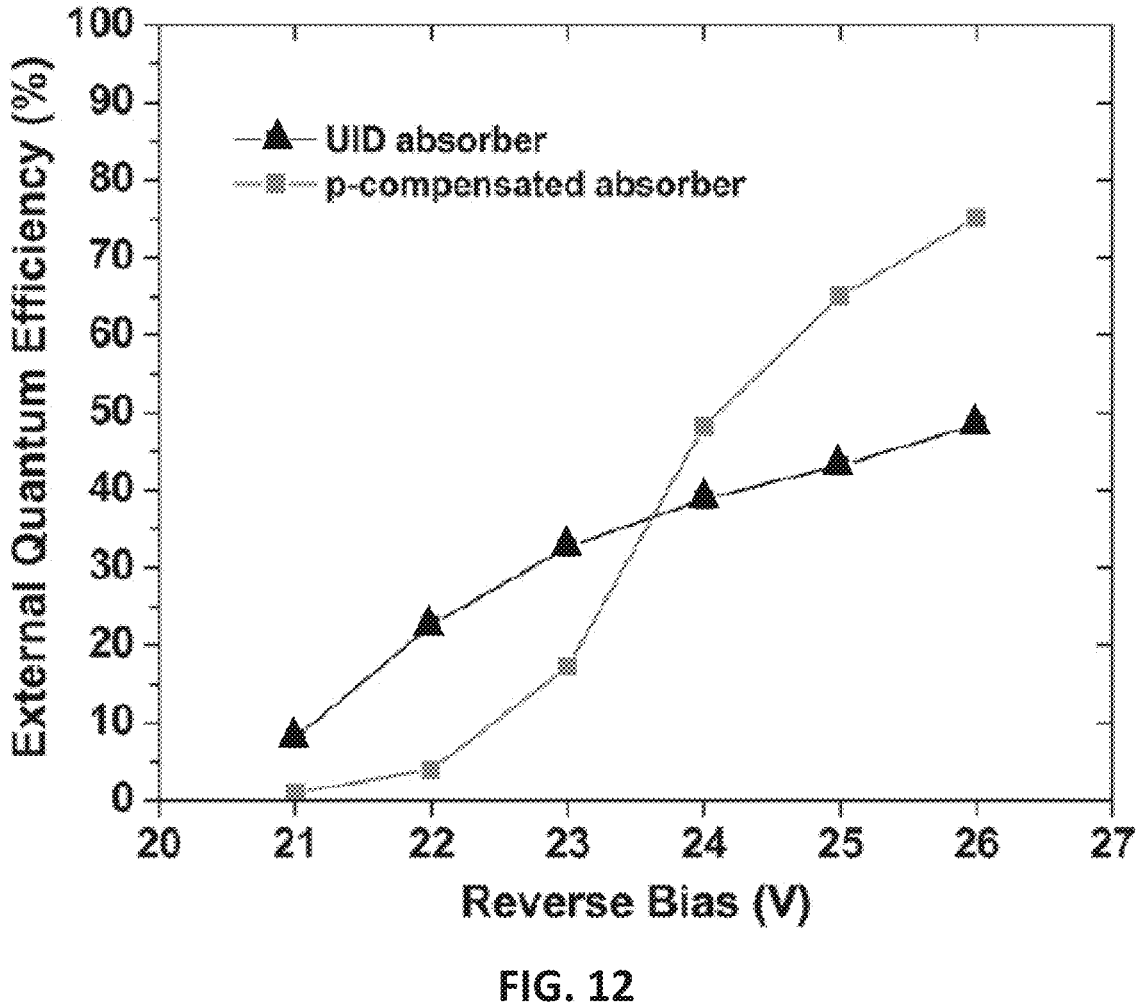

FIG. 12 illustrates the calculated external quantum efficiency of the APD design shown in FIG. 6 having an absorption layer comprising an UID (black) and a p-compensated (gray) AlInAsSb, as a function of the reverse bias applied on the APD.

DETAILED DESCRIPTION

Introduction

Photodetectors are devices that convert optical energy to electrical current (herein referred to as photocurrent). A photodiode is a type of photodetector that includes one or more junctions formed between two or more layers comprising semiconducting material. A Photodiode absorbs a photon flux incident on an absorption layer of the photodetector and generates a photocurrent comprising charge carriers generated by absorbed photons in the absorption layer. In some embodiments, the photodiode may comprise at least a first and a second contact layers. A contact layer may allow flow of charge carriers (e.g., electrons and/or holes) between layers that are in contact with the contact layer and a conductive line. The photocurrent may flow from a first contact layer to a second contact layer though various layers of the APD. In some embodiments, the photodiode can be biased by generating a potential difference across the one or more layers of the photodiode. In some such embodiments, the potential difference may be generated by applying a voltage (e.g., a reverse voltage that reverse biases the photodiode), on a first contact layer different from a voltage applied on the second contact layer. In some embodiments, at least one of the contact layers may be connected to a ground potential. The voltage may be applied by connecting the corresponding conductive line to a voltage source. In some embodiments, in addition to the photocurrent, a photodiode may generate a dark current independent of the incident light. In some embodiments, a photodetector may be characterized by at least the photocurrent and the dark current that it generates for a given optical power incident on the absorption layer and given bias voltage.

In some embodiments, a conventional PIN photodiode may comprise a first layer comprising p-type semiconductor, a second layer comprising n-type semiconductor, and third layer extended from the first layer to the second layer comprising an intrinsic semiconductor. In some applications, the responsivity or the sensitivity of a PIN photodiode may not be sufficient and photodiodes with intrinsic gain mechanisms may be needed to generate a larger photocurrent by absorbing a smaller number of photons. For example, in applications such as quantum computation, quantum communication, quantum sensing, astronomy, or night vision, a system may need a higher sensitivity than sensitivity levels that ca be provided by conventional PINs to detect light comprising a small number of photons (e.g., a single photon), or count the number photons in an incident beam.

Avalanche photodiodes (APDs) are photodiodes that provide an intrinsic gain by allowing multiplication of charge carriers as they move along the photodiode. As such, a small number of photogenerated charge carriers (also referred to as photocarriers) may generate a large photocurrent resulting in high sensitivity. In some embodiments, the multiplication of charge carriers may comprise generation of charge carriers via impact ionization. In various embodiments, charge carriers may comprise electrons and/or holes. APDs are widely deployed in scientific, telecommunication, military, and other applications that may benefit from their high sensitivity enabled by the internal gain. In various embodiments, to provide sufficient internal gain, an APD may be biased (e.g., reverse biased) to generate a relatively large electric field within a region of the APD where charge carrier multiplication occurs.

Generation of and amplification of photocurrent in an APD generally involves generation of noise current that may include a shot noise current comprising shot noise associated with the photocurrent and shot noise associated with the dark current. Noise current can limit the sensitivity of the APD because a photocurrent that has a magnitude smaller than the corresponding noise current, may not be detected.

In some embodiments, due to the stochastic nature of the impact ionization process, the intrinsic gain M (e.g., the avalanche gain) of an APDs contributes to the shot noise current generated by the APD. For example, the mean-squared of the shot noise current ($i_{shot}$) for an APD having a gain M may be expressed as:

$$\langle i_{shot}^2 \rangle = 2qM^2(I_{ph}+I_d)F(M)\Delta f \qquad (1)$$

where q is the absolute value of the electric charge of the corresponding charge carrier (e.g., electron or hole), $i_{ph}$ and $i_d$ are photocurrent and dark current respectively, $\Delta f$ is the bandwidth of the photodiode, and F is the excess noise factor. In some embodiments, the excess noise factor may be written as:

$$F(M)=kM+(1-k)(2-1/M) \qquad (2)$$

where k is the ratio of the hole impact ionization coefficient ($\beta$), to the electron impact ionization coefficient ($\alpha$). As such, the contribution of the gain to the noise current is determined by k. In some embodiments, for a given material used in the APD (e.g., in the multiplication layer), k may be a static value that can be measured and characterized. As indicated by equation 2, the excess noise factor increases with increasing gain, and the rate at which the excess noise increases is controlled by k. For example, for a given value of gain, the excess noise may increase slower for smaller values of k. As such, APDs that have lower k values may generate lower excess noise for a given gain. Since receiver circuit noise can be unavoidable, when the contributions of the APD to a total noise of the system do not exceed that of the receiver circuit noise, the APD may provide a distinct advantage in low-noise, high-sensitivity photodetection. Some of the materials used in the disclosed APD designs (e.g., AlInAsSb alloys) may have low values of k.

As indicated by equation 1, the mean-squared of the shot noise current is proportional to the sum of the photocurrent and the dark current. As such, the signal-to-noise ratio of the current generated by an APD can be increased by reducing the dark current. Dark current of an APD may be generally determined by the APD design (e.g., characteristics and arrangement of different layers used in the APD). In some examples, the dark current may result from generation, recombination, and band-to-band tunneling (e.g., in the absorption region). Additionally, the dark current may be determined by the magnitude of the electric field along the APD generated by biasing the APD. As such, larger intrinsic gain in an APD may result in generation of a larger dark current and thereby making the design of high gain and low noise APDs a challenging task in particular for detection of larger wavelengths (e.g., within mid-IR spectral range), where the material that absorbs light has a narrow-bandgap, the APD may generate more dark current (e.g., via band-to-band tunneling).

In some embodiments, the length of the multiplication region of an APD may be increased to reduce the overall E-field. However, in these embodiments, reducing the material background carrier concentration to allow for full depletion of the device may be difficult.

In some embodiments, the magnitude of the electric field in a narrow bandgap material where light is absorbed may be reduced by spatially separating the absorption region from the multiplication region where high E-field may be generated to provide sufficient intrinsic gain. As such, in some embodiments, an APD may comprise distinct layers for generating photocarriers, and amplifying the resulting photocarriers. In some such embodiments, the APD may comprise a third layer that allows transport of the photocarriers from a layer that absorbs light to a layer where the photocarriers are multiplied. In some examples, the layer in which light is absorbed and the photocarriers are generated may be referred to as absorption layer, the layer in which the photocarriers are multiplied (e.g., by impact ionization), may be referred to as multiplication layer, and the layer the allows the transport of the photocarriers from the absorption layer to the multiplication layer may be referred to as charge layer. In some examples, the charge layer may comprise a low-doped layer or a graded layer (a layer having a graded band gap and graded material composition). An APD that comprises three separate layers for generating, transporting, and multiplication of photocarriers, may be referred to as separate absorption charge, and multiplication APD or SACM APD.

In some embodiments, the dark current of an APD may be determined by the material, doping, and geometrical properties of one or more layers of the APD. For example, the dark current of a SACM APD may increase by decreasing the bandgap of the absorption layer. As such, SACM APDs with operating at longer wavelengths may generate more dark current. In some embodiments, the amount of dark current generated by an APD may be reduced by tailoring the energy bandgap variation along the photodiode (e.g., in an interface between the absorption layer and the charge layer).

APD Designs with Reduced Dark Current

Detection of light having a wavelength within infrared (IR) spectral range (e.g., near-IR or mid-IR spectral ranges) can benefit many applications. For example, mid-IR detection may have applications in medical instruments, environmental monitoring, imaging, range finding, astronomy, and spectroscopy. As a result, the development of IR detectors has been an area of intensive research and development. APDs that operate in near-IR or mid-IR wavelength range require bandgaps which are narrow enough to absorb low energy near-IR or mid-IR photons. As described above, SACM APD designs may be used in these embodiments to reduce the dark current in the presence of a large internal E-filed.

Recently, the $Al_xIn_{1-x}As_ySb_{1-y}$ material system (hereafter referred to as AlInAsSb or $Al_xInAsSb$) has been used as the structural material for various regions of APDs. As a quaternary compound material, different layers comprising $Al_xIn_{1-x}As_ySb_{1-y}$ can be lattice matched while widely tuning the corresponding energy bandgaps from the visible to the mid-IR. As such, AlInAsSb is highly suitable for SACM APDs, as both the narrow-bandgap absorption and wide-bandgap multiplication region can be finely tailored by adjusting the composition of AlInAsSb (e.g., by adjusting the stoichiometric ratio between Al and In in the compound) for specific uses. Room-temperature operation of AlInAsSb based SACM APDs has been demonstrated for both 1.55 and 2-µm applications with noise characteristics similar to those of silicon. By altering the Al content of the alloy and carefully designing charge layers which adequately suppress the electric field (E-filed) in the narrow-bandgap absorption, AlInAsSb based SACM APDs can be designed which operate at longer wavelengths (e.g., deeper in the IR spectral range, greater than 2 microns, or 3 microns). In some embodiments, the energy bandgap variation along the absorption and charge layer may be tailored such to form a conduction band barrier between the absorption region and multiplication region that lowers under reverse bias to enable photogenerated electrons to drift into the multiplication region. Impact ionization, which may occur in a higher-Al, wide bandgap region, can exhibit the well characterized low noise behavior seen in the AlInAsSb materials system.

Previously, AlInAsSb material was used to design and fabricate photodiode for detecting light having a wavelength near 850 nm with single photon sensitivity. The APD designs described below may have operating wavelength ranges extend to longer wavelengths (e.g., mid-IR wavelengths) or cutoff wavelengths within mid-IR wavelengths. In some embodiments, the disclosed APDs may allow single photon detection in the near-IR and mid-IR wavelength ranges. An APD capable of detecting single photons having a wavelength in the near-IR and mid-IR spectral ranges (e.g., 1300 nm, 1550 nm, 2000 nm, 2500 nm, 3000 nm or larger), may have a variety of applications including quantum computing, quantum communication, night vision, spectroscopy, gas sensing/analysis, range finding, and quantum sensing. In some embodiments, the disclosed APD designs may comprise a SACM APD that can provide sufficient gain while generating noise currents that are small enough to allow detection of single photons in the IR wavelength range (e.g., in the mid-IR wavelength range).

Figure 1:
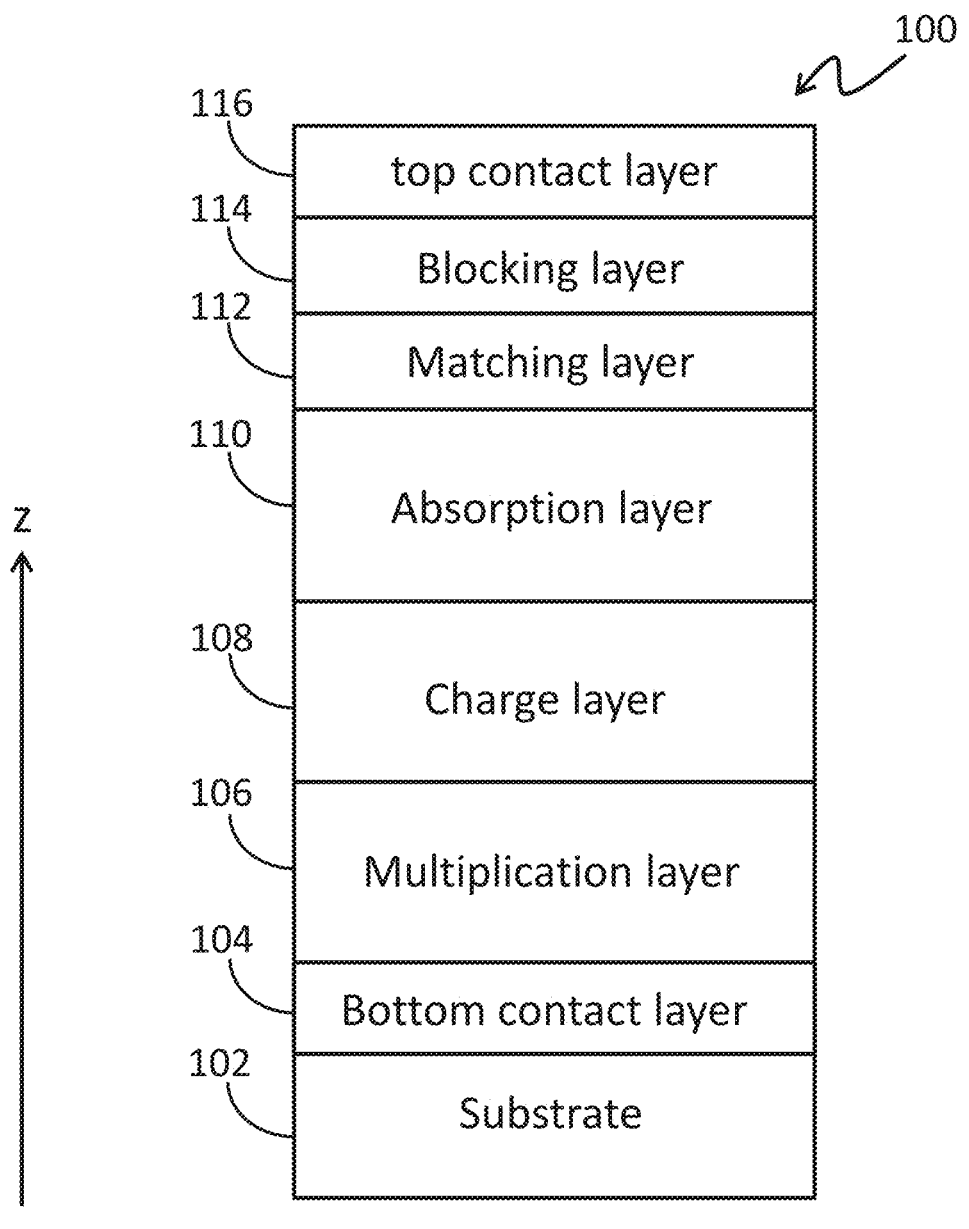
FIG. 1 schematically illustrates a cross section of an example avalanche photodiode having separate absorption, charge, and multiplication regions (SACM APD).

FIG. 1 illustrates a cross section of an example APD 100 having separate absorption, charge, and multiplication regions (a SACM APD). In some embodiments, the APD 100 may include a substrate 102, a bottom contact layer 104 adjacent to the substrate 102, a multiplication layer 106 adjacent to the bottom contact layer 104 and opposite to the substrate 102, a charge layer 108 adjacent to the multiplication layer 106 and opposite to the bottom contact layer 104, an absorption layer 110 adjacent to the charge layer 108 and opposite to the multiplication layer 106, a matching layer 112 adjacent to absorption layer 110 and opposite to the charge layer 108, a blocking layer 114 adjacent to the matching layer 112 and opposite to the absorption layer 110, and a top contact layer 116 adjacent to the blocking layer 114 and opposite to the matching layer 112. In some embodiments, adjacent layers may be disposed on top of each other, and an interface may be formed between two adjacent layers. For example, the charge layer may be disposed on the multiplication layer forming an interface between the charge layer and the multiplication layer 106, and the absorption layer may be disposed on the charge layer 108 forming an interface between the charge layer 108 and the absorption layer 110. In various embodiments, the materials used in each layer and the structure of the APD 100 may vary. In some examples, two or more layers may comprise the same material having the same elements (e.g., a compound semiconductor material) but with different compositions (e.g., different stoichiometric ratios between at least two element of the material). In some embodiments, the absorption layer 110 may be configured to absorb at least light having a wavelength within an operating wavelength range of the APD 100. As such, the absorption layer 110 may have energy bandgap (e.g., between a valence band and a conduction band) that is smaller than a photon energy associated with operating wavelength range of the APD 100. In some embodiments, the operating wavelength range of an APD may comprise a spectral region having an upper bound referred to as cut off wavelength. In some embodiments, the operating wavelength range of the APD 100 may comprise the near-IR spectral range (e.g., 900 nm-2000 nm) or the mid-IR spectral range (e.g., 2000 nm-6000 nm). The charge layer 108 may be configured to allow transport of the charge carriers (e.g., electrons, or holes) from the absorption layer 110 to the multiplication layer 106. The multiplication layer 106 may be configured to enable multiplication of the charge carriers received from the charge layer 108 via a charge carrier multiplication mechanism (e.g., impact ionization).

In some embodiments, the charge layer 108 may be designed to allow charge carriers to move from the absorption layer 110 to the multiplication layer 106 and decrease a rate of band-to-band tunneling (e.g., near the interface between the charge layer 108 and the absorption layer 110).

In some embodiments, a layer of the APD 100 may include two or more sublayers having different compositions, different bandgaps, different bandgap characteristics (e.g., variation along a growth direction), different elements, different dopants, and/or different doping concentrations. A layer or sublayer may be extended from a first interface with a previous layer or sublayer to a second interface with the next layer or sublayer. Each layer or sublayer of the APD 100 may have a thickness along a growth direction of the APD (e.g., z-axis in FIG. 1).

In some embodiments, a layer or sublayer of the APD 100 may have a bandgap different from the bandgap of an adjacent layer or sublayer. In some embodiments, the bandgap of a layer or sublayer may remain constant within the layer or sublayer.

In some embodiments, the energy bandgap of each layer or sublayer of the APD 100 may be tailored by material selection and/or adjusting the composition of the selected material (e.g., by adjusting the stoichiometric ratio between at least two elements in the material).

In some embodiments, a layer or sublayer may be graded by changing the stoichiometric ratio between two elements from first point to a second point within the layer or sublayer, e.g., along the thickness of the layer/sublayer or a material growth direction (z-direction in FIG. 1). In some such embodiments, the bandgap of the layer or sublayer may change from the first point to the second point within the layer or sublayer. In some embodiments, the bandgap of a layer or sublayer may change abruptly at point within the layer or sublayer (e.g., with a rate greater than $10^{-4}$-$10^{-3}$ eV/nm, $10^{-3}$-$10^{-2}$ eV/nm, $10^{-2}$-$10^{-1}$ eV/nm, $10^{-1}$-$3\times10^{-1}$ eV/nm, $3\times10^{-1}$-$5\times10^{-1}$ eV/nm, and $5\times10^{-1}$-1 eV/nm).

In some embodiments, the bandgap of a layer or sublayer (herein referred to graded layer or sublayer) can be graded at least within a portion of the layer. For example, the graded bandgap may gradually change from a first point to a second point within the layer or sublayer along a grading direction (e.g., a material growth direction). In some embodiments, a graded bandgap may increase or decrease linearly or nonlinearly along the grading direction. In some embodiments, a graded bandgap may change linearly within a first portion of a graded sublayer (or layer) and change nonlinearly within a second portion of the graded sublayer (or layer). In some such embodiments, a rate of change of the bandgap may be different within the first and the second portions. Additionally, the graded bandgap may be substantially constant within a third portion (different from the first and the second portions) of a graded sublayer (or layer).

In some embodiments, the bandgaps of a layer or sublayer may be tailored to improve the performance of the APD within the operating wavelength range of the APD. For example, the bandgap of a layer may be tailored to reduce the dark current of the APD, to increase the responsivity of the APD, to reduce the overall noise generated by the APD, or to improve other aspects of the APD performance.

In some examples, the charge layer 108 may comprise two or more sublayers where at least one sublayer (e.g., an interfacial sublayer having an interface with the absorption layer) is designed such that under reverse bias the electric field (E-filed) generated in a tunneling region of the APD 100 (e.g., a region of the charge layer 108 adjacent to the absorption layer 110), is greater than a first E-field threshold value to permit charge carrier transport from the absorption layer 110 to the multiplication layer 106 via the charge layer 108, and smaller than second E-field threshold value to suppress charge carrier tunneling. In some embodiments, a composition of a portion of charge layer 108 the first and the second E-field threshold. In some examples, at least one of the sublayers of the charge layer may comprise a graded bandgap. A graded layer or graded sublayer may comprise a compound semiconductor material having a stoichiometric ratio between two elements of the compound where the stoichiometric ratio is graded along a grading direction (e.g., along the growth direction). For example, a graded layer or sublayer may comprise $A_xB_{1-x}$ where x increases or decreases along the grading direction. In various examples, x may change linearly or nonlinearly along the grading direction. In various examples, within a first portion of the graded sublayer (or layer), x changes linearly along the grading direction, and within a second portion of the graded sublayer (or layer), x changes nonlinearly along the grading direction.

In some embodiments, a rate of change of a material property (e.g., a stoichiometric ratio, or doping) within a graded layer or a graded sublayer may be less than a threshold value. Alternatively, or in addition, the variation of the energy bandgap within a graded layer may not include a discontinuity or step potential barrier.

In various embodiments, a graded layer and or a graded sublayer, is a single layer or single sublayer distinct from adjacent layers or sublayers.

In some embodiments, a sublayer of the charge layer that is adjacent to and in contact with the absorption layer may have a band gap that is greater than the bandgap of the absorption layer at least by a factor of 1.1, 1.2, 1.3, 1.4, 1.5, 1.6, 1.7, 1.8, 1.9, 2, 2.5, or other values but not exceeding 3. In some embodiments, a bandgap of a sublayer of the charge layer at or near an interface between the sublayer and the absorption layer, can be greater than the bandgap of the absorption layer least by a factor of 1.1, 1.2, 1.3, 1.4, 1.5, 1.6, 1.7, 1.8, 2, 2.5, or other values but not exceeding 3. In some such embodiments, the bandgap of the sublayer and/or the absorption layer may change along the growth direction and away from the interface.

In some embodiments, a sublayer of the charge layer that is adjacent to and in contact with the absorption layer may comprise a first material and the charge layer may comprise a second material. In some embodiments, a first region of a sublayer of the charge layer that is adjacent to and in contact with second region and of the absorption layer may comprise a first material and the second region of the charge layer may comprise a second material. In some embodiments, the first region and the second region each may comprise 1 to 10 atomic layers. In some embodiments, the first material and the second material may comprise the same compound semiconductor material (having the same elements) but may have different stoichiometric ratios between two elements of the compound. For example, the first material may comprise $A_xB_{1-x}$ and the second material may comprise $A_yB_{1-y}$ where a difference between x and y is greater than 0.1, 0.2, 0.3, or 0.5 but smaller than 1.

FIG. 2 illustrates a cross section of the charge, absorption and multiplication layers 200 of (collectively referred to as CAM block) of an example SACM APD (e.g., the APD 100 shown in FIG. 1). In the example shown, the charge layer 208 comprises two sublayers a first charge sublayer 208a and second charge sublayer 208b where the first charge sublayer 208a has an interface with the multiplication layer 206 and the second charge layer has an interface with the absorption layer 210. In some embodiments, the second charge sublayer 208b may comprise a graded sublayer. In some embodiments, the charge layer 208 and the absorption layer 210 may comprise the same compound semiconductor material but may have different stoichiometric ratios between two elements of the compound. For example, the first charge layer may comprise $A_xB_{1-x}$, the second charge layer may comprise and the absorption layer may comprise $A_zB_{1-z}$, where v changes (e.g., linearly or non-linearly) from x to z from the interface between the first charge sublayer 208a and the second charge sublayer 208b to the interface between the second charge sublayer 208b and the absorption layer 210. In some such embodiments, element A may be Aluminum (Al), element B may be Indium (In), and the absorption layer 210, the charge layer 208, and the multiplication layer 206 may comprise $Al_xIn_{1-x}As_ySb_{1-y}$.

Examples of SACM APDs having a CAM block described above with respect to FIG. 2 are disclosed in U.S. Pat. No. 10,032,950 B2, the entire contents of which are incorporated by reference herein and made a part of this specification.

FIG. 3 illustrates a cross section of the charge, CAM block 300 of another example of a SACM APD (e.g., the APD shown in FIG. 1). The CAM block shown in FIG. 3 may be used in different embodiments of the SACM APDs disclosed herein (e.g., SACM APDs having an operating wavelength range within mid-IR spectral range). In some embodiments, the CAM block shown in FIG. 3 may comprise a charge layer 308 designed to reduce a dark current of the corresponding APD, e.g., by reducing charge carrier recombination, e.g., when the APD is under reverse bias. In some embodiments, charge layer 308 may comprise three sublayers a first charge sublayer 308a, a second charge sublayer 308b, and a third charge sublayer where the first charge sublayer 308a has an interface with the multiplication layer 306 and the third charge sublayer 308c has an interface with the absorption layer 310, and the second charge sublayer 308b is extended from an interface with the first charge sublayer 308a to an interface with the third charge sublayer 308c. In some cases, the third charge sublayer 308c may be referred to as first interfacial charge sublayer, the second charge sublayer 308b may be referred to as intermediate charge sublayer, and the first charge sublayer 308a may be referred to as second interfacial charge sublayer.

In some embodiments, the second charge sublayer 308b may comprise a graded sublayer having a graded energy bandgap. In some embodiments, a composition of the second charge sublayer may be graded from a composition of the first charge sublayer to a composition of the third charge sublayer. In some embodiments, a composition of the second charge sublayer may be graded from a composition of the first charge sublayer to a composition of the third charge sublayer through a combination of linear change, nonlinear change, stepwise change, and/or no change along a growth direction the second charge layer. In some embodiments, the charge layer 308 and the absorption layer 310 may comprise the same compound semiconductor material but may have different stoichiometric ratios between two elements of the compound. In some embodiments, the first charge sublayer 308a may comprise $A_xB_{1-x}$, the second charge sublayer 308b may comprise $A_yB_{1-y}$, and the third charge sublayer 308c may comprise $A_wB_{1-w}$, and the absorption layer 310 may comprise $A_zB_{1-z}$. In some embodiments, y changes from x to w from the interface between the first and the second charge sublayers to the interface between the second charge sublayer and the third charge sublayer. In some embodiments, a difference between w and z is greater than 0.1, 0.2, 0.3, or 0.5 but smaller than 1. In some embodiments the lower bound for difference between w and z may be determined based at least in part on the magnitude of a dark current (e.g., a desired dark current or a dark current that allows single photon detection) and the upper bound may be determined by the magnitude of a photocurrent generated by the corresponding APD (e.g., a photocurrent generated at an operating bias voltage and upon receiving light having intensities in a desired range). In some embodiments, element A may be Aluminum (Al), element B may be Indium (In), and the absorption layer 310, the charge layer 308, and the multiplication layer 304 may comprise $Al_xIn_{1-x}As_ySb_{1-y}$.

In some embodiments, a stoichiometric ratio between A and B in the third charge sublayer 308c (w/(1−w)) can be greater than a stoichiometric ratio between A and B in the absorption layer 310 (z/(1−z)) by a factor greater than 3, greater than 4, greater than 5, greater than 6, but smaller than 7. In some embodiments, the lower bound for the ratio between the stoichiometric ratios between Al and In in the third charge sublayer 308c and the absorption layer 310 may be determined based at least in part on the magnitude of a dark current (e.g., a desired dark current or a dark current that allows single photon detection) and the upper bound may be determined by the magnitude of a photocurrent generated by the corresponding APD (e.g., a photocurrent generated at an operating bias voltage and upon receiving light having intensities in a desired range). In some embodiments, a stoichiometric ratio between A and B in the absorption layer 310 (z/(1−z)) can be smaller than a stoichiometric ratio between A and B in the third charge sublayer 308c (w/(1−w)) by a factor smaller than ⅓, smaller than ¼, smaller than ⅕, or smaller.

In some embodiments, the thicknesses and the doping densities of the charge sublayers 308a-308c can be selected to provide an electric field profile that is high in the multiplication layer 304 and low in the absorption layer 310. In some such embodiments, the product of the thickness and the doping of one or more of the charge sublayers 308a-308c may be used as a design parameter to an electric field profile that is high in the multiplication layer 304 and low in the absorption layer 310. The thickness, doping density, and/or the product of doping density and thickness of a charge sublayer may be determined based at least in part on the energy bandgap of the multiplication layer 304 and/or the energy bandgap of the absorption layer 310. For example, the product the doping density and thickness of a charge sublayer can be proportional to a difference between the energy bandgaps of the multiplication layer 304 and the energy bandgap of the absorption layer 310. Given that the energy bandgap of the absorption layer is determined based on the operating wavelength range of the corresponding APD, the thickness and doping densities of the charge sublayers may depend on the operating wavelength range and may be designed and optimized based on the material and composition of the absorption layer.

In some embodiments, a layer or sublayer may have at least one layer characteristic or feature different from one or more adjacent layers or sublayers (e.g., layers or sublayers having an interface with the layer and the sublayer). The layer characteristic may include: a material type (e.g., elements included in the material), material composition (e.g., stoichiometric ratios for different materials), a rate of change of material composition (e.g., a rate of change of stoichiometric ratios for different materials) along a growth direction, energy bandgap, energy bandgap characteristics (e.g., energy bandgap variation along a growth direction), dopants, and/or doping concentration. For example, two adjacent layer or sublayers may comprise the same type of material (e.g., having the same elements) having different compositions (e.g., different stoichiometric ratios between different elements). As another example, two adjacent layers or sublayers may comprise the same types of material having the same compositions but different doping concentrations.

Figure 4A:
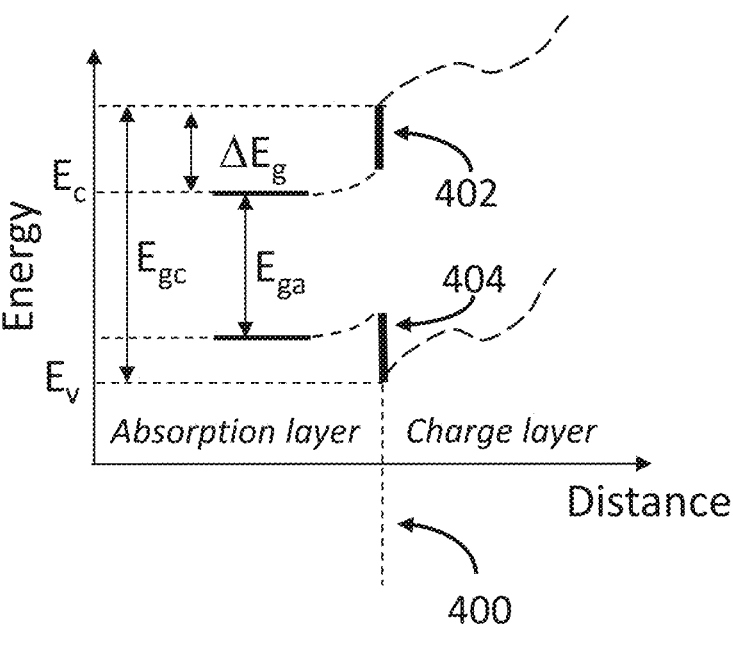
FIG. 4A schematically illustrates the energy band diagram near the interface between the absorption layer and the charge layer of the example SACM APD shown in FIG. 3.

FIG. 4A illustrates the energy band diagram near an interface 400 between the absorption layer 310 and the charge layer 308 of the CAM block 300. The energy band diagram may represent variation of the conduction and valence band energies (Ec and Ev) along a direction perpendicular to the interface between the absorption layer 310 and the charge layer 308 (e.g., along the growth direction or z-direction). In some embodiments, an energy bandgap $E_{ga}$ of the absorption layer 310 can be smaller than an energy bandgap $E_{gc}$ of a region of the charge layer 308 (e.g., the third charge sublayer 307c) near the interface between the absorption layer the absorption layer 310 and the charge layer 308. In some embodiments, the region of the charge layer 308 that has an energy bandgap $E_{gc}$ may be extended 10 nm, 30 nm, 50 nm, 80 nm, or 100 nm away from the interface. In some embodiments, the thickness of the region of the charge layer 308 that has an energy bandgap $E_{gc}$ may be determined based at least in part on a doping of this region.

In some embodiments, $E_{ga}$ can be from $1.2 \times E_{gc}$ to $1.5 \times E_{gc}$, from $1.5 \times E_{gc}$ to $2 \times E_{gc}$, from $2 \times E_{gc}$ to $2.5 \times E_{gc}$, from $2.5 \times E_{gc}$ to $3 \times E_{gc}$. In some embodiments the lower bound for difference between $E_{gc}$ and $E_{ga}$ may be determined based at least in part on the magnitude of a dark current (e.g., a desired dark current or a dark current that allows single photon detection) and the upper bound may be determined by the magnitude of a photocurrent generated by the APD (e.g., a photocurrent generated at an operating bias voltage and upon receiving light having intensities in a desired range). In some examples, the ratio $E_{gc}/E_{ga}$ may be determined based at least in part on a value of $E_{ga}$. The value of $E_{ga}$ may be selected based on a desired operating wavelength range of the APD (e.g., mid-IR wavelength range). In some embodiments, the ratio $E_{gc}/E_{ga}$ may be determined based at least in part on a range of optical intensities that maybe detected by the corresponding APD and/or a range of photocurrents that maybe generated by the APD.

In various embodiments, the difference between $E_{gc}$ and $E_{ga}$ may result in a potential barrier between the absorption layer 310 and the charge layer 308 (e.g., near or at the interface 400). In some examples, a size of the potential barrier between the absorption layer 310 and the charge layer can be tailored by adjusting the difference between $E_{gc}$ and $E_{ga}$ and/or the material and composition of the absorption layer 310 and the region of the charge layer 308 near the interface (e.g., the third charge sublayer). In some embodiments, the size of the potential barrier may be tailored such that when the corresponding APD is reverse biased at an operating bias voltage, the charge carriers can move from the absorption layer 310 to the charge layer 308 but the local E-field near the interface is reduced compared to a case where no potential barrier exists near the interface. In some embodiments, the potential barrier may comprise a potential barrier 402 in the conduction band. In some embodiments, the potential barrier may comprise a potential barrier 402 in the conduction band and a corresponding potential barrier 404 in the valence band. In some such embodiments, the reduced E-filed near the interface may decrease a probability of charge carrier tunneling (e.g., for example between conduction band and the valence band) near the interface. For example, when the charge carrier transport is dominated by the electrons, the potential barrier $\Delta E_g$ in the conduction band may be tailored such that when the corresponding APD is biased (e.g., reverse biased) the resulting potential barrier is large enough to reduce electron tunneling from the conduction band to the valence band but small enough to allow electron transport from the absorption layer to the multiplication layer via the charge layer.

Figure 4B:
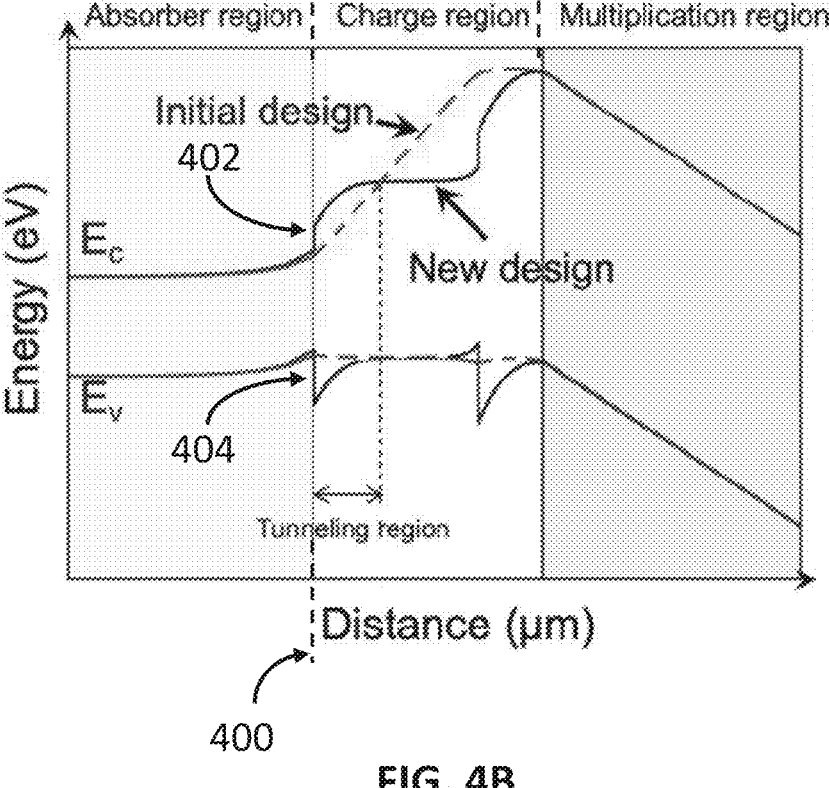

FIG. 4B illustrates the energy band diagrams of two different variations of the SACM APD designs, across the absorption, charge, and multiplication layers. In some embodiments, the energy band diagrams shown in FIG. 4B may represent the variation of conduction and valence band energies ($E_c$ and $E_v$) for along the CAM block 200 (dashed line labeled as "Initial design") and the CAM block 300 (solid line labeled as "New design"). The region marked "tunneling region" can be a region in which the electric field under reverse bias is large enough to permit carriers to surmount the barrier and small enough to suppress tunneling.

In some embodiments, the second charge sublayer of the CAM block 200 can be graded having an energy bandgap graded (e.g., continuously) from the absorption layer 210 to the multiplication layer 206. In some such embodiments, the energy bandgap variation along such CAM block (depicted by the dashed line) may not suppress tunneling and therefore may not decrease the dark current to a level required for single photon detection.

In some embodiments, to reduce the dark current in an APD (e.g., an APD having an absorption region with narrow bandgap for operation in mid-IR spectral range), the CAM block 300 may be used. In some embodiments, where the third charge sublayer 308c of the CAM block 300 has a bandgap greater than the bandgap of the absorption layer 310 (similar to example shown in FIG. 4A), the energy bandgap variation along the CAM block 300 (depicted by the solid line) may comprise a step-like potential barrier (e.g., the potential barrier 402 in the conduction band) at or near the interface 400 between the absorption layer 310 and the charge layer 308. Such potential barrier may be large enough to suppresses tunneling in the tunneling region and small enough to permit charge carrier (e.g., electron) transmission from the absorption layer to the charge and then multiplication layer, when the corresponding APD is reverse biased. In some embodiments, the dark current of an APD that comprises the energy band diagram depicted by the solid line in FIG. 4B, may be low enough to allow single photon detection.

As described above, when the CAM block 300 is used in APD 100, the resulting bandgap variations may reduce dark current by suppressing charge carrier (e.g., electron) tunneling between the conduction band and the valence band, in particular near the interface between the absorption layer 310 and the charge layer 308. Such design is particularly suitable for mid-IR APDs where the narrow energy bandgap of the absorption layer may increase generation of dark current.

FIG. 5 illustrates a cross section of an embodiment of an APD 500 according to the present disclosure. In some embodiments, APD 500 may have an operating wavelength range within the mid-IR spectral range.

The APD 500 may comprise a bottom contact layer 504. In some embodiments, the bottom contact layer 504 may comprise GaSb or InP. In some embodiments, the thickness of the bottom contact layer 504 can be from 100 nm to 1000 nm nanometers. In some embodiments, the bottom contact layer 504 may comprise an n-type semiconductor material having a doping density from $10^{18}$ to $10^{19}$ cm$^{-3}$.

In some embodiments, the APD 500 may comprise a multiplication layer 506 adjacent to the bottom contact layer 504. In some embodiments, the multiplication layer 506 may have a thickness from 100 to 2000 nanometers. In some examples, the multiplication layer 506 may comprise AllnAsSb. In some such examples, the multiplication layer 506 may have a composition $Al_xIn_{1-x}As_ySb_{1-y}$. In some such examples, x may have a value from 0.5 to 0.9. In some embodiments, the multiplication layer 506 may comprise an unintentionally doped (UID) n-type semiconductor material.

In some embodiments, the APD 500 may comprise a charge layer 508, adjacent to the multiplication layer 506 opposite the bottom contact layer 504. In some examples, the charge layer 508 may comprise AlInAsSb. In some embodiments, the charge layer 508 may include a first charge sublayer 508a adjacent to the multiplication layer 506 opposite to the bottom contact layer 504, a second charge sublayer 508b adjacent to the first charge sublayer 508a opposite to the multiplication layer 506, and a third charge sublayer 508c, adjacent to the second charge sublayer 508b opposite to the first charge sublayer 508a. In some cases, the third charge sublayer 508c may be referred to as first interfacial charge sublayer, the second charge sublayer 508b may be referred to as intermediate charge sublayer, and the first charge sublayer 508a may be referred to as second interfacial charge sublayer.

In some embodiments, the first, second, third charge sublayers 508a-c may comprise AlInAsSb. In some such embodiments, at least two charge sublayers may have different stoichiometric ratios between Al and In. In some examples, the first charge sublayer 508a may have a composition $Al_{x1}In_{1-x1}As_ySb_{1-y}$. In some such case, x1 can have a value from 0.3 to 0.7. In some examples, the third charge sublayer 508c may comprise $Al_{x3}In_{1-x3}As_ySb_{1-y}$. In some such examples, x3 can have a value from 0.3 to 0.6. In some examples, the second charge sublayer 508b may comprise a graded layer having a composition that is graded from the composition of the first charge sublayer 508a to the composition of the third charge sublayer 508c. In some such examples, the second charge sublayer 508b layer may have a composition $Al_{x2}In_{1-x2}As_ySb_{1-y}$, where x2 changes (e.g., linearly or non-linearly) from x3 to x1 along the growth direction (e.g., z-direction). In some embodiments, the thickness of the first charge sublayer 508a can be from 10 to 200 nanometers. In some embodiments, the thickness of the second charge sublayer 508b can be from 10 to 200 nanometers. In some embodiments, the thickness of the third charge sublayer 508c can be from 10 to 200 nanometers.

In some embodiments, the first charge sublayer 508a may comprise a p-type semiconductor material having a doping density from $5\times10^{15}$ to $5\times10^{17}$ cm$^{-3}$. In some embodiments, the second charge sublayer 508b may comprise a p-type semiconductor material having a doping density from $5\times10^{15}$ to $5\times10^{17}$ cm$^{-3}$. In some embodiments, the third charge sublayer 508c may comprise a p-type semiconductor material having a doping density from $5\times10^{15}$ to $5\times10^{17}$ cm$^{-3}$.

The APD 500 may comprise an absorption layer 510 adjacent to the charge layer 508, opposite the multiplication layer 506, where the absorption layer 510 may comprise AlInAsSb. In some examples, the absorption layer 510 have a composition $Al_xIn_{1-x}As_ySb_{1-y}$. In some such examples, x may have a value from 0 to 0.5. In some embodiments, the thickness of the absorption layer can be from 100 to 2000 nanometers. In some embodiments, the absorption layer 510 may comprise an unintentionally doped (UID) n-type semiconductor material. In some embodiments, the absorption layer 510 may comprise a p-type semiconductor material having a doping density from $5\times10^{15}$ to $5\times10^{16}$ cm$^{-3}$.

In some embodiments, a stoichiometric ratio between Al and In in the third charge sublayer 508c (x3/(1−x3)) can be greater than a stoichiometric ratio between Al and In in the absorption layer 510 (x/(1−x)) by a factor greater than 3, greater than 4, greater than 5, greater than 6, but smaller than 7. In some embodiments, the relation between the composition of the absorption layer 510 and the third charge sublayer 508c may be specified by limiting the values of x and x3 based on a limiting condition, e.g., an inequality expressed as $5>\{[x3/(1-x3)]/[x/(1-x)]\}>3$. In some embodiments, the lower bound for the ratio between the stoichiometric ratios between Al and In in the third charge sublayer 308c and the absorption layer 310 may be determined based at least in part on the magnitude of a dark current (e.g., a desired dark current or a dark current that allows single photon detection) and the upper bound may be determined by the magnitude of a photocurrent generated by the corresponding APD (e.g., a photocurrent generated at an operating bias voltage and upon receiving light having intensities in a desired range). In some embodiments, a stoichiometric ratio between Al and In in the absorption layer 510 $(x/(1-x))$ can be smaller than a stoichiometric ratio between Al and In in third charge sublayer 508c $(x3/(1-x3))$ by a factor smaller than $\frac{1}{3}$, smaller than $\frac{1}{4}$, smaller than $\frac{1}{5}$, smaller than $\frac{1}{6}$, or smaller. In some embodiments, the relation between the composition of the absorption layer 510 and the third charge sublayer 508c may be specified by limiting the values of x and x3 based on a limiting condition, e.g., an inequality expressed as $\frac{1}{5}<\{[x/(1-x)]/[x3/(1-x3)]\}<\frac{1}{3}$.

In some embodiments, the APD 500 may comprise a matching layer 512 (also referred to as a "grading layer") adjacent to the absorption layer 510, opposite the charge layer 508, where the matching layer may comprise AlInAsSb. In some embodiments, the matching layer 512 may include two sublayers: a first matching sublayer adjacent to the absorption layer 510 and opposite to the third charge sublayer 508c, and a second matching sublayer adjacent to the first matching sublayer and opposite to the absorption layer 510. In some examples, the first matching sublayer may be lattice matched to the absorption layer 510 and the second matching sublayer may be latticed matched to the blocking layer 514. In some examples, the first and the second matching sublayers may comprise AlInAsSb, where the first matching sublayer has a stoichiometric ratio between Al and In similar to that of the absorption layer 510, and the second matching sublayer has a stoichiometric ratio between Al and In similar to that of the blocking layer 514. In some embodiments, the first and the second matching sublayers may have a composition $Al_xIn_{1-x}As_ySb_{1-y}$. In some such embodiments, x can have a value from 0.15 to 0.7. In some embodiments, the first and second matching sublayers may have a thickness from 20 to 200 nanometers. In some embodiments, the first and second matching sublayers may comprise p-type semiconductor having a doping density from $5\times10^{15}$ to $5\times10^{17}$ $cm^{-3}$. In some embodiments, the first and second matching sublayers may have substantially equal doping densities. In some embodiments, the first and second matching sublayers 512a/512b may have substantially equal thicknesses.

In some examples, the matching layer 512 may be a graded layer having a composition that is graded from the composition of the absorption layer 510 to the composition of the blocking layer 514 along the growth direction (e.g., z-direction).

The APD 500 may comprise a blocking layer 514 adjacent to the matching layer 512, opposite the absorption layer 510. In some embodiments, the blocking layer 514 may comprise AlInAsSb. In some examples, the blocking layer 514 may have a composition $Al_xIn_{1-x}As_ySb_{1-y}$. In some such examples, x can have a value from 0.5 to 0.9. In some embodiments, the thickness of the blocking layer can be from 20 to 200 nanometers. In some embodiments, the blocking layer 514 may comprise a p-type semiconductor material having a doping density from $5\times10^{16}$ to $5\times10^{17}$ $cm^{-3}$.

The APD 500 may comprise a top contact layer 516 adjacent to the blocking layer 514, opposite to the matching layer 512. In some embodiments, the top contact layer may comprise GaSb or InP. In some embodiments, the thickness of the top contact layer 516 can be from 10 to 300 nanometers. In some embodiments, the top contact layer 516 may comprise a p-type semiconductor material having a doping density from $1\times10^{18}$ to $1\times10^{19}$ $cm^{-3}$.

In some embodiments, the APD 500, may comprise a substrate layer 502 positioned adjacent to the bottom contact layer 504, opposite the multiplication layer 506. In some examples, the substrate layer 502 may comprise GaSb or InP. In some embodiments, the substrate layer 502 may comprise an n-type semiconductor material.

In some embodiments, the APD 500 may further comprise a buffer layer. In some embodiments, the buffer layer may comprise GaSb. In some embodiments, the buffer may have a thickness from 100 to 500 nanometers. In some embodiments, the buffer layer may comprise an n-type material having a doping density from $1\times10^{18}$ to $1\times10^{19}$ $cm^{-3}$. In some embodiments, the doping density of the buffer layer may be substantially equal to the doping density of the bottom contact layer 504.

In some embodiments, the APD 500 may further comprise at least one conductive line in electrical communication with bottom contact layer 504 and at least one conductive line in electrical communication with top contact layer 516. In some examples, the conductive lines may comprise titanium, gold, or other conductive materials.

Any of the layers or the sublayers referred to with regards to any of the embodiments of the devices discussed above, may be integrally or separately formed with one another. Further, redundant functions or structures of the layers or sublayers may be implemented. It should be appreciated that various sizes, dimensions, contours, rigidity, shapes, flexibility, and materials of any of the layers or sublayers or portions of the layers and the sublayers in the various embodiments of the devices discussed above may be varied. Similarly, locations and alignments of the various layers and sublayers may vary. It should be appreciated that the devices discussed herein, and related layers and sublayers of the device, may take on all shapes along the entire continual geometric spectrum of manipulation of x, y and z planes. Moreover, locations, connections and alignments of the various layers and sublayers may vary. It should be appreciated that two layers that have different material compositions or different compositions may comprise the same type of compound semiconductor material (having the same elements) but with different stoichiometric ratios between at least two elements of the compound. It should be appreciated that two layers that have the same compositions may comprise the same type of compound semiconductor material (having the same elements) with the same stoichiometric ratios, however they may have different doping densities of a p-type or n-type dopant. Example ranges of AL content, thickness, and doping concentrations that may be used for different layers and sublayers of the APD 500 are provided in Table 1. In some APD designs (e.g., SACM APD designs), one or more parameters may have values outside of the ranges provided in Table 1.

TABLE 1

| Layer/sublayer | Al content | Thickness (nm) | Doping (cm$^{-3}$) |
| --- | --- | --- | --- |
| Top contact layer | NA | 10-300 | $1 \times 10^{18}$-$1 \times 10^{19}$ |
| Blocking | 0.5-0.9 | 20-200 | $5 \times 10^{16}$-$5 \times 10^{17}$ |
| Matching | 0.15-0.7 | 20-200 | $5 \times 10^{15}$-$5 \times 10^{17}$ |
| Absorption | 0-0.5 | 100-2000 | $5 \times 10^{15}$-$5 \times 10^{16}$ |
| $3^{rd}$ charge | 0.3-0.6 | 10-200 | $5 \times 10^{15}$-$5 \times 10^{17}$ |
| $2^{nd}$ charge | Graded | 10-200 | $5 \times 10^{15}$-$5 \times 10^{17}$ |
| $1^{st}$ charge | 0.3-0.7 | 10-200 | $5 \times 10^{15}$-$5 \times 10^{17}$ |
| Multiplication | 0.5-0.9 | 100-2000 | — |
| Bottom contact layer | NA | 10-300 | $1 \times 10^{18}$-$1 \times 10^{19}$ |
| Buffer | NA | 100-500 | $1 \times 10^{18}$-$1 \times 10^{19}$ |

Example APD Design

Practice of embodiments of the APD designs described above may be better understood from the following example and experimental results, which are presented herein for illustration only and should not be construed as limiting the disclosed designs and devices in any way.

FIG. 6 illustrates a cross section of an embodiment of an APD 600 according to the present disclosure. The APD 600 may be a SCAM APD having an operating wavelength range in mid-IR spectral range. The layers of the APD 600 may comprise one or more features described above with respect to the APD 100, APD 500, or the CAM block 300. In various embodiments, various layers of the APD 600 may comprise AlInAsSb with different compositions (e.g., different stoichiometric ratios between one or more elements).

In some embodiments of the APD 600, may comprise a substrate layer 602 disposed on a buffer layer 603, and a bottom contact layer 604 disposed on the buffer layer 603. The substrate layer 602 and the buffer layer 603 may comprise n-type GaSb and the bottom contact layer 604 may comprise n-type $Al_{0.7}In_{0.3}As_ySb_{1-y}$ (herein referred to as $Al_{0.7}InAsSb$). In some embodiments, the buffer layer may have a thickness of 200 nm and a doping density of $5 \times 10^{18}$ cm$^{-3}$. In some embodiments, the bottom contact layer 604 may have a thickness of 400 nm and a doping density of $5 \times 10^{18}$ cm$^{-3}$.

In some embodiments, the value of y in $Al_xIn_{1-x}As_ySb_{1-y}$ in a layer may be selected based at least in part on x and composition and/or lattice constant of the adjacent layers.

In some embodiments, the APD 600 may include a multiplication layer 606, a charge layer 608 disposed on the multiplication layer 606, and an absorption layer 610 disposed on the charge layer 608. In some embodiments, the multiplication layer may comprise unintentionally doped n-type $Al_{0.7}InAsSb$. In various embodiments, the absorption layer 610 may comprise p-type (intentionally doped) or unintentionally doped n-type $Al_{0.15}InAsSb$. In some such examples, the p-type $Al_{0.15}InAsSb$ may have a doping density of $1 \times 10^{16}$ cm$^{-3}$ (intentionally doped). In some embodiments, the multiplication layer 606 may have a thickness of 500 nm and the absorption layer 610 may have a thickness of 1000 nm. In some embodiments, the charge layer 608 may include a first charge sublayer 608a having a thickness of 80 nm disposed on the multiplication layer 606, a second charge sublayer 608b having a thickness of 120 nm disposed on the first charge sublayer 608a, and a third charge sublayer 608c having a thickness of 80 nm disposed on the second charge sublayer 608b. In some embodiments, the first charge sublayer 608a may comprise p-type $Al_{0.7}InAsSb$ having doping density of $1 \times 10^{17}$ cm$^{-3}$. In some embodiments, the third charge sublayer 608c may comprise p-type $Al_{0.4}InAsSb$ having doping density of $1 \times 10^{17}$ cm$^{-3}$. In some embodiments, the second charge sublayer 608b may comprise a graded p-type $Al_xInAsSb$ having doping density of $1 \times 10^{17}$ cm$^{-3}$, where x varies along the thickness of the second charge sublayer 608b from 0.7 at the interface between the first and the second charge sublayers 608a/608b to 0.4 at the interface between the second and the third charge sublayers 612b/612c. In various embodiments, x varies linearly or non-linearly along the grown direction (z-direction).

In some embodiments, the doping density of the charge sublayers 608a-608c (or charge sublayers 508a-508c), may be designed to enhance charge transport from the absorption layer 610 (or the absorption layer 510) to the multiplication layer 606 (or the multiplication layer 506) given a background carrier concentration and/or carrier polarity in each sublayer.

In some embodiments, the APD 600 may further include a matching layer 612 disposed on the absorption layer 610, a blocking layer 614 disposed on the matching layer 612, and a top contact layer 616 disposed on the blocking layer 614. The matching layer 612 may include a first matching sublayer 612a disposed on the absorption layer 610 and a second matching sublayer 612b disposed on the first matching sublayer 612a. The first matching sublayer 612a may comprise p-type $Al_{0.15}InAsSb$ having doping density of $1 \times 10^{18}$ cm$^{-3}$ and the second matching sublayer 612b may comprise p-type $Al_{0.7}InAsSb$ having doping density of $1 \times 10^{18}$ cm$^{-3}$. In some embodiments, the first and the second matching sublayers 612a/612b may have a thickness of 100 nanometers. The blocking layer 614 may comprise p-type $Al_{0.7}InAsSb$ having a doping density of $9 \times 10^{18}$ cm$^{-3}$. The blocking layer 614 may have a thickness of 50 nanometers. The top contact layer 616 may comprise p-type GaSb having a doping density of $5 \times 10^{18}$ cm$^{-3}$. The top contact layer 616 may have a thickness of 30 nanometers.

In some embodiments, the APD 600 may further comprise at least one conductive line 605 in electrical communication with bottom contact layer 604 and at least one conductive line 617 in electrical communication with top contact layer 616. In some examples, a conductive line may comprise aluminum, copper, gold, titanium or gold, or other conductive materials including various metal alloys.

FIG. 7A illustrates the energy band diagrams of the APD 600 having an absorption layer 610 comprising an unintentionally-doped (UID) n-type $Al_{0.15}InAsSb$, calculated at three different reverse bias voltages (0 V, 25V, 30 V) applied on the APD 600 between the top contact layer 616 and the bottom contact layer 604 (e.g., via the conductive lines 605 and 617).

FIG. 7B illustrates the energy band diagrams of the APD 600 having an absorption layer comprising an intentionally-doped p-type $Al_{0.15}InAsSb$, simulated at three different reverse bias voltages (0 V, 25V, 30 V) applied on the APD 600 between the top contact layer 616 and the bottom contact layer 604 (e.g., via the conductive lines 605 and 617).

As evident from FIG. 7A and FIG. 7B, the size of the potential barrier (e.g., the potential barrier 702 in the conduction band) formed at the interface 700 between the charge layer 608 and absorption layer 610 (due to differences between the composition of the third charge sublayer 608c and the absorption layer 610), changes at different reverse bias voltages applied on the APD 600. In various embodiments, the charge layer and the absorption layers of the APD 100, APD 500, APD 600, or the CAM block 300 may be designed such that under a desired bias voltage the size of the potential barrier remains large enough to reduce the dark current (e.g., associated with bad-to-band tunneling) and small enough to allow charge carrier (e.g., electron) transport from the absorption layer to the multiplication layer via the charge layer. In some embodiments, the size of the potential barrier may be tailored by tailoring the energy band gap of the third charge sublayer, the difference or the ratio between the energy bandgap of the absorption layer and the charge layer, a ratio between the stoichiometric ratios of an element in a compound material used as the third charge sublayer and the absorption layer (e.g., Al in AlInAsSb), the thickness of the third charge sublayer, and other parameters.

The data presented in FIG. 8 to FIG. 12 is associated (e.g., directly or via calculations or numerical modeling) with measurement results obtained from fabricated APDs comprising the structure and material system of APD 600.

FIG. 8 illustrates the capacitance plotted versus reverse bias voltage for the APD 600 with an absorption layer 610 comprising UID n-type $Al_{0.15}InAsSb$ (dashed line), herein referred to as UID design, and with an absorption layer 610 comprising intentionally doped p-type compensated (p-compensated) $Al_{0.15}InAsSb$ (solid line), herein referred to as p-compensated design. Both UID and p-compensated designs have a diameter of 200 microns. The punch-through voltages for the UID and p-compensated designs are approximately 23 and 25 V reverse respectively reverse bias, respectively. As shown in FIG. 8 the UID design is fully depleted at approximately −23 V, while the p-compensated design is still depleting beyond the punch-through voltage of approximately −25 V. The capacitance values in FIG. 8 may be used to estimate the doping densities for each design. For example, the estimated doping density for the p-compensated design is $1.2 \times 10^{16}$ $cm^{-3}$ and remains constant for reverse voltages above 25 V very close to the as-designed doping density in the absorption layer 610. The depletion characteristics of the absorption layer 610 for the UID and p-compensated designs may be inferred from the band diagrams shown in FIG. 7A and FIG. 7B. For example, FIG. 7A shows although the UID design fully depletes above the punch-through voltage, the low native n-type doping in the absorption layer 610 results in formation of a barrier that may impede the injection of the photocarriers (e.g., photogenerated electrons in the absorption layer 610) into the multiplication layer 606. FIG. 7B shows while the p-compensated design may require a higher reverse bias voltage to fully deplete, once fully depleted, the APD may allow photocarriers (e.g., photogenerated electrons in the absorption layer 610), to be injected to the multiplication layer 306 without passing through a barrier.

FIGS. 9A and 9B illustrate the current versus bias voltage and gain versus bias voltage (insets) characteristics of the APD 600 having an UID absorption layer 610 when the temperature of the device is 240 K (FIG. 9A), and 100 K (FIG. 9B).

FIGS. 9C and 9D illustrate the current versus bias voltage and gain versus bias voltage (insets) characteristics of the APD 600 having an intentionally doped p-compensated absorption layer 610 when the temperature of the device is 240 K (FIG. 9C), and 100K (FIG. 9D).

The solid curves in FIGS. 9A-9D indicate calculated current for unilluminated APDs (no photons are absorbed by the absorption layer 610). The dashed curves in FIG. 9A-9D indicate calculated current for APDs illuminated with light having a wavelength of 2 microns. The input optical power levels at 240 K were approximately 5 μW and 7.7 μW for the UID and p-compensated curves, respectively. At 100 K, these powers have been reduced by approximately 6 dB to maximize gain through reduced saturation. The devices used to obtain the current-bias and gain-bias plots curves shown in FIG. 9A-9D has a diameter of 150 microns.

Assuming electron-initiated impact ionization, the gain-bias curves in FIG. 9A-9D were calculated by first simulating the electric field profiles of each APD design using a Poissonian solver and then using the previously characterized impact ionization coefficients of $Al_{0.7}InAsSb$ in equation:

$$M = \frac{(\alpha - \beta)e^{W(\alpha-\beta)}}{\alpha - \beta e^{W(\alpha-\beta)}} \quad (3)$$

where W is the thickness of the multiplication layer 606. For both designs the gain (Al) may be initially calculated at a reverse bias voltage of 26 V, which is slightly above the punch-through voltage for both designs. For the UID design, the gain at the reverse bias of 26 V can be 1.35 when the device temperature is at 240 K (degrees Kelvin or Kelvin) or 100 K. For the p-compensated design the gain at the reverse bias of 26 V can be 1.61 when the device temperature is at 240 K or 100 K. The difference between gains in the two designs may be associated with the difference between the electric-field magnitude in the multiplication layer 606 of each design. For example, the electric-field magnitude can be larger in the multiplication layer 606 of the p-compensated design compared to that of the UID design (e.g., due to the additional charge present in the p-compensated design). In some examples, the gain-bias curve may be determined by scaling the measured photocurrent by these initial values. For the p-compensated design, the maximum gain can be approximately 50 and 380 at 240 and 100 K, respectively.

FIG. 10 illustrates the dark current density plotted against reverse bias voltage for the APD 600 having a p-compensated design, at different temperatures. The first curve from bottom represents current-bias of the APD 600 at temperature of 100 K, and each curve above it represents current-bias of the APD 600 at temperature 20 K higher than the previous curve. The top curve represents current bias of the APD 600 at temperature of 300 K. According to FIG. 10, the dark current density of the APD with p-compensated design decreases with temperature indicating that the dark current is dominated by recombination-generation processes.

FIGS. 11A and 11B illustrate the spectral response of the APD 600 having an (A) UID absorption layer and (B) an intentionally doped absorption layer at a temperature of 240 K. For both UID and p-compensated designs the spectral responses were measured as reverse bias voltage was increased from 21 to 26 V as indicated by the arrows. The spectral response of the APDs were measured using double-modulated Fourier-transform IR (FTIR) spectroscopy at 240 K near the punch-through voltage for each device. The voltage drop across a 100-Ω series resistor was sent to an electronic signal processing system that computes the spectral response. The photoresponse of a spectrally flat pyroelectric detector was used to remove the variations associated with the electronic signal processing system. As indicated by FIGS. 11A and 11B, for both designs the spectral response rapidly increases at reverse bias voltages greater than the punch-through voltage. FIGS. 11A and 11B, further indicate that the spectral response of both APD designs decreases at larger wavelengths and above 3.0 microns the impact of the reverse bias on the response significantly diminishes. The measured spectral responses shown in FIGS. 11A and 11B agree with the expected spectral response based on the properties of the absorption layer comparing $Al_{0.15}InAsSb$. In particular, the estimated cut off wavelength (about 3 microns) in in good agreement with the predicted bandgap energy of $Al_{0.15}InAsSb$ (approximately 0.403 eV).

FIG. 12 illustrates the calculated external quantum efficiency (EQE) versus reverse bias voltage for an example APD 600 having an absorption layer comprising an UID (triangular data points) and a p-compensated (square data points) absorption layer 610. The external quantum efficiency of each device is calculated based on the photocurrent generated when the device was illuminated by a light beam having a wavelength of 2 microns. At each reverse bias voltage, the external quantum efficiency is estimated by calculating the external quantum efficiencies at multiple optical intensities of optical beam and then averaging the resulting external quantum efficiencies. The rapid increase in the quantum efficiency of the p-compensated design (square data points) may be associated with the depletion of the charge layer in the device. The absence of a rapid increase in the quantum efficiency of the UID design may be associated with significant charge trapping in the device structure. The relative magnitudes between the quantum efficiencies of the p-compensated and UID designs are in good agreement with the corresponding spectral responses shown in FIGS. 11A and 11B and further corroborate the previously described charge barrier problem for the UID design. At the punch-through voltage of −25 V, the p-compensated design provides an EQE of 65% under illumination by light having a wavelength of 2 microns (e.g., light generated by a laser source).

In various embodiments, an anti-reflection layer may be disposed on the top contact layer 616 to reduce reflection of the incident light from the air-GaSb interface (e.g., a Fresnel reflection of 35% at 2 microns). The anti-reflection layer may enhancement the EQE across the operational wavelength range of the APD.

In some embodiments, during operation the APD 100, APD 500, or APD 600 maybe reverse biased by applying a potential difference between a top conductive line and a bottom conductive line of the APD. In some examples, the reverse bias voltage can be from 5 to 10 Volts, 10 to 15 Volts, 15 to 20 Volts, 20 to 25 Volts, 25 to 30 Volts, 30 to 35 Volts, or 35 to 40 Volts.

In some embodiments, when the APD 100, APD 500, APD 600, or an APD that includes the CAM block 300 is reverse biased, the magnitude of a photocurrent generated by the APD upon absorption of a single photon may be greater than a dark current generated by the APD. As such, the APD designs described above may be used for single photon detection and photon counting in applications including quantum communication, quantum computation, quantum cryptography, quantum sensing, and the like. In some embodiments, the threshold temperature can be from 100K to 150 K, from 150 K to 200 K, or form 250 K to 300 K.

In some embodiments, the APD 100, APD 500, APD 600, or an APD that includes the CAM block 300, may provide an external quantum efficiency from 20% to 60%, from 60% to 70%, 70% to 80%, from 80% to 90%, or from 90% to 95%, at wavelength within near-IR or mid-IR spectral range without using an antireflection layer on the APD (e.g., on the top contact layer)

In some embodiments, the APD 100, APD 500, APD 600, or an APD may include an antireflection layer (e.g., disposed on the top contact layer) to increase transmission of light incident on the APD to the absorption layer. In some embodiments, the presence of the antireflection layer may improve the external quantum of the corresponding APD by 10% to 15%, 15% to 20%, 20% to 30%, 30% to 40%, or other values.

In some embodiments, the APD 100, APD 500, APD 600, or the CAM block 300, may be integrated (e.g., monolithically integrated) with one or more photonic and/or electronic devices (e.g., on the same substrate).

In some embodiments, the APD 100, APD 500, APD 600, or the CAM block 300, may be integrated or may be in communication (e.g., optical or electrical) with a quantum system (e.g., a photonic quantum system). For example, any of these APDs may be used to detect photons associated with qubits in a quantum system.

In some embodiments, the APD 100, APD 500, APD 600, or the CAM block 300, may be integrated or may be in communication (e.g., optical or electrical) with a LIDAR system. In some embodiments, any of these APDs may receive light generated by an emission system of the LIDAR system and transmit a photocurrent generated by the received light to a subsystem of the LIDAR system (e.g., a readout circuit, or a signal processing subsystem). In some embodiments, the APD may be monolithically integrated with one of more devices (e.g., photonic and/or electronic) of the LIDAR system on a single chip. In some embodiments, the light generated by the LIDAR system may have a wavelength between 800 to 1200 nm, 1200 to 1500 nm, 1500 to 2000 nm, 2000 to 3000 nm or larger.

In some embodiments, the APD 100, APD 500, APD 600, or the CAM block 300, may be integrated or may be in communication (e.g., optical or electrical) with a night vision system. In some embodiments, any of these APDs may receive thermal emission generated by an object or IR light reflected by the object and transmit a photocurrent generated by the received thermal emission or IR light to a subsystem of the night vision system (e.g., a readout circuit, or a signal processing subsystem). In some embodiments, the APD may be monolithically integrated with one or more devices (e.g., photonic and/or electronic) of the night vision system on a single chip configured to detect a wavelength between 800 to 1200 nm, 1200 to 1500 nm, 1500 to 2000 nm, 2000 to 3000 nm or larger.

Growth and Fabrication

In various embodiments, the APD 100, APD 500, or APD 600 may be fabricated using epitaxial growth techniques such as molecular beam epitaxy (MBE), epitaxial Chemical Vapor deposition (CVD), or atomic layer epitaxy (ALE). In some embodiments, both UID and p-compensated designs described with respect to APD 600 may be grown on n-type Te-doped GaSb (001) substrates by solid-source molecular beam epitaxy as a digital alloy of the binary semiconductors. In some embodiments, when the background carrier concentration has been lowered through outgassing, AlInAsSb can be natively n-type. In some embodiments, a natively low n-type, material (e.g., AlInAsSb) may be referred to as unintentionally doped (UID). In some embodiments, once the multiplication layer has been developed on the bottom contact layer, the Beryllium (p-type) source can be activated. This is used to create the initial charge sublayer by developing a thin layer of material with a wide bandgap (e.g., $Al_{0.7}InAsSb$). Next, the growth can be gradually adjusted down to $Al_{0.4}InAsSb$, which forms the second charge sublayer, thereby creating a graded energy bandgap for comparison. The growth may be adjusted by grading down linearly, nonlinearly, or stepwise to form the second charge sublayer. Finally, the third charge sublayer may be formed by growing a thin layer of $Al_{0.4}InAsSb$. As described above, the third charge sublayer may mitigate the high fields that can arise in the charge layer as the device is depleted (e.g., under reverse bias). Since the magnitude of E-field in the charge layer can be greater than that the magnitude of E-field in the absorption layer, the third charge sublayer that has wider-bandgap than the absorption layer may be tailored to protect the APD from premature tunneling breakdown. Once the device is completed by growing the remaining layers, circular mesas may be defined by conventional photolithography and formed by a two-step etching process. The etching process may include a first step where the mesas are partially etched using reactive ion etching (ME) with inductively coupled plasma and a second step where the mesas are completely etched all the way down to the bottom contact layer (e.g., n-type $Al_{0.7}InAsSb$) by wet etching using citric/phosphoric acid solution. Finally, the devices may be passivated with SU-8 to reduce surface leakage current. Ti/Au contacts may be deposited using electron-beam evaporation.

Example Embodiments

Various additional example embodiments of the disclosure can be described by the following clauses:

Group 1

Example 1. An avalanche photodiode (APD) configured to allow generation and amplification of a photocurrent upon receiving light while limiting the generation of a dark current, wherein the light comprises incident photons having wavelengths within an operating wavelength range of the APD, the APD comprising:

an absorption layer configured to absorb the incident photons, the absorption layer comprising a first semiconductor material having a first energy bandgap;

a multiplication layer configured to allow multiplication of charge carriers generated in the absorption layer, the multiplication layer comprising a second semiconductor material having a second energy bandgap;

a charge layer disposed between the multiplication layer and the absorption layer, wherein the charge layer comprises:

a first interfacial charge sublayer adjacent to the absorption layer, the first interfacial charge sublayer having a first thickness and comprising a third semiconductor material having a third energy bandgap;

an intermediate charge sublayer adjacent to the first interfacial charge sublayer opposite to the absorption layer, the intermediate charge sublayer having a second thickness and comprising a fourth semiconductor material having a fourth energy bandgap; and wherein the third energy bandgap is greater than the first energy bandgap by a factor greater than 1.2 at least at an interface between the first interfacial charge sublayer and the absorption layer.

Example 2. The avalanche photodiode of Example 1, further comprising a second interfacial charge sublayer adjacent to the intermediate charge sublayer opposite to the first interfacial charge sublayer, the second interfacial charge sublayer having a third thickness and comprising a fifth semiconductor material having a fifth energy bandgap different from the third energy bandgap.

Example 3. The avalanche photodiode of Example 1, wherein the ratio between the third energy bandgap and the first energy bandgap is smaller than 3.

Example 4. The avalanche photodiode of Example 1, wherein the first thickness is from 10 nm to 200 nm.

Example 5. The avalanche photodiode of Example 1, wherein the second thickness is from 10 nm to 200 nm.

Example 6. The avalanche photodiode of Example 2, wherein the third thickness is from 10 nm to 200 nm.

Example 7. The avalanche photodiode of Example 1, wherein the operating wavelength range of the APD is within a mid-infrared spectral range.

Example 8. The avalanche photodiode of Example 7, wherein the operating wavelength range is from 2 microns to 6 microns.

Example 9. The avalanche photodiode of Example 7, wherein the APD is reverse biased, and a single photon photocurrent generated by a photon of the incident photons is greater than the dark current.

Example 10. The avalanche photodiode of Example 9, wherein the APD operates at a temperature greater than 200 K.

Example 11. The avalanche photodiode of Example 2, wherein the fourth energy bandgap is graded along the second thickness.

Example 12. The avalanche photodiode of Example 11, wherein the fourth energy bandgap is graded from the third energy bandgap to the fifth energy bandgap.

Example 13. The avalanche photodiode of any of Examples 11-12, wherein the intermediate charge sublayer is a single layer.

Example 14. The avalanche photodiode of Example 2, wherein a composition of the fourth semiconductor material is a graded from a composition of the third semiconductor material at an interface between the first interfacial charge sublayer and the intermediate charge sublayer to a composition of the fifth semiconductor material at an interface between the intermediate charge sublayer and the second interfacial charge sublayer.

Example 15. The avalanche photodiode of Example 2, wherein the fifth energy bandgap is substantially equal to the second energy bandgap at least at an interface between the multiplication layer and the second interfacial charge sublayer.

Example 16. The avalanche photodiode of Example 2, wherein the third and fifth semiconductor materials comprise the same elements, and wherein each of the third and fifth semiconductor materials has different stoichiometric ratios between at least two elements.

Example 17. The avalanche photodiode of Example 2, wherein the first, second, third, fourth, and fifth semiconductor materials comprise p-type AlInAsSb.

Example 18. The avalanche photodiode of Example 2, wherein the first, second, third, fourth, and fifth semiconductor materials comprise AlInAsSb.

Example 19. The avalanche photodiode of Example 18, wherein the first semiconductor material has a composition of $Al_zIn_{1-z}AsSb$ with z=0 to 0.5.

Example 20. The avalanche photodiode of Example 18, wherein the second semiconductor material has a composition of $Al_mIn_{1-m}AsSb$ with m=0.5 to 0.9.

Example 21. The avalanche photodiode of Example 18, wherein the third semiconductor material has a composition of $Al_xIn_{1-w}AsSb$ with w=0.3 to 0.6.

Example 22. The avalanche photodiode of Example 21, wherein the fifth semiconductor material has a composition of $Al_xIn_{1-x}AsSb$ with x=0.3 to 0.7.

Example 23. The avalanche photodiode of Example 22, wherein the fourth semiconductor material has a composition of $Al_yIn_{1-y}AsSb$, and wherein y is graded from w from an interface between the first interfacial charge sublayer and the intermediate charge sublayer to x at an interface between the intermediate charge sublayer and the second interfacial charge sublayer.

Example 24. The avalanche photodiode of Example 1, further comprising:

a substrate layer;

a bottom contact layer extended from the substrate layer to the multiplication layer;

a matching layer adjacent to the absorption layer opposite to the first interfacial charge sublayer;

a blocking layer adjacent to the matching layer opposite to the absorption layer; and a top contact layer adjacent to the blocking layer opposite to the matching layer;

wherein the bottom contact layer is configured to allow charge carrier transport between a bottom conductive line and the multiplication layer; and wherein the top contact layer is configured to allow charge carrier transport between a top conductive line and the blocking layer.

Example 25. The avalanche photodiode of Example 24, wherein a composition of the matching layer is graded from a composition of the absorption layer at an interface between the matching layer and the absorption layer to a composition of the blocking layer at an interface between the matching layer and the blocking layer.

Example 26. The avalanche photodiode of Example 24, wherein the matching layer comprises a first matching sublayer having a composition of the absorption layer and second matching sublayer having a composition of the blocking layer.

Example 27. The avalanche photodiode of Example 24, wherein the top and bottom contact layers comprise InP or GaSb.

Example 28. The avalanche photodiode of Example 24, wherein the blocking layer and the matching layer comprise AlInAsSb.

Example 29. A light detection and ranging (LIDAR) system comprising:

an emission system configured to generate a light beam; and the avalanche photodiode (APD) of any of the Examples above, wherein the avalanche photodiode is configured to receive a portion of the light beam and generate the photocurrent based at least in part on the light beam.

Example 30. The LIDAR system of Example 29 wherein the portion of the light beam comprises light reflected by an object in an environment monitored by the LIDAR system.

Example 31. The LIDAR system of Example 29, further comprising a detection system configured to receive the photocurrent.

Example 32. The avalanche photodiode of Example 29, wherein the APD is integrated with the LIDAR system.

Example 33. The avalanche photodiode of any of the Examples 29-32, wherein the light beam has a wavelength from 2 microns to 4 microns.

Example 34. A night vision system comprising the avalanche photodiode (APD) of any of the Examples above, wherein the APD is configured to receive a thermal emission generated by an object or light reflected by the object and generate the photocurrent based at least in part on the thermal emission or reflected light.

Example 35. The avalanche photodiode of Example 34, wherein the APD is integrated with the night vision system.

Example 36. The avalanche photodiode of Examples 34 or 35, wherein the reflected light has a wavelength from 2 microns to 4 microns.

Example 37. A method of converting a beam of light to a photocurrent, the method comprising:

disposing the avalanche photodiode (APD) of any of the Examples 1-28 in an optical path of the beam of light; and receiving the photocurrent generated by the APD in response to the beam of light contacting the APD.

Example 38. The method of Example 37, further comprising biasing the APD using a reverse bias voltage.

Example 39. An avalanche photodiode comprising:

a) an absorption layer configured to receive light and generate a photocurrent in response thereto;

b) a multiplication layer proximate to the first layer configured to amplify the generated photocurrent;

c) a bottom contact layer in communication with the absorption layer and the multiplication layer, wherein the multiplication layer is configured to grow on the bottom contact layer;

d) a source of p-type dopant, such as Beryllium, configured to activate and facilitate the growth of a first charge sublayer by depositing a thin layer of wide-bandgap material, such as $Al_{0.7}InAsSb$; and e) a second charge sublayer formed by grading down to a material with a second bandgap, such as $Al_{0.4}InAsSb$, creating a graded energy bandgap;

wherein the avalanche photodiode is configured to limit the generation of a dark current while allowing generation and amplification of the photocurrent upon reception of light.

Example 40. The avalanche photodiode of Example 39 further comprising a third charge sublayer comprising a thin layer of the material with the second bandgap.

Group 2

Example 1. An avalanche photodiode (APD) configured to allow generation and amplification of a photocurrent upon receiving light while limiting the generation of a dark current, wherein light comprises incident photons having wavelengths within an operating wavelength range of the APD, the APD comprising:

an absorption layer configured to absorb the incident photons, the absorption layer comprising a semiconductor material having a composition comprising $A_zB_{1-z}$;

a multiplication layer configured to allow multiplication of charge carriers generated in the absorption layer; and a charge layer extended from the multiplication layer to the absorption layer, wherein the charge layer comprises:

a first interfacial charge sublayer adjacent to the absorption layer, the first interfacial charge sublayer having a first thickness and comprising a semiconductor material having a composition comprising $A_wB_{1-w}$; and an intermediate charge sublayer adjacent to the first interfacial charge sublayer opposite to the absorption layer, the intermediate charge sublayer having a second thickness and comprising a semiconductor material having a composition comprising $A_yB_{1-y}$;

wherein the absolute value of difference between w and z is greater than 0.1.

Example 2. The avalanche photodiode of Example 1, wherein the absolute value of difference between w and z is less than 1.

Example 3. The avalanche photodiode of Example 1, wherein z has a value from 0 to 0.5.

Example 4. The avalanche photodiode of Example 1, wherein w has a value from 0.3 to 0.6.

Example 5. The avalanche photodiode of Example 1, wherein the first thickness is from 10 nm to 200 nm.

Example 6. The avalanche photodiode of Example 1, wherein the second thickness is from 10 nm to 200 nm.

Example 7. The avalanche photodiode of Example 1, wherein y is different from w at least in a portion of the intermediate charge sublayer.

Example 8. The avalanche photodiode of Example 1, wherein the operating wavelength range of the APD is within a mid-infrared spectral range.

Example 9. The avalanche photodiode of Example 8, wherein the operating wavelength range is from 2 microns to 6 microns.

Example 10. The avalanche photodiode of Example 8, wherein the APD is reverse biased, and a single photon photocurrent generated by a photon of the incident photons is greater than the dark current.

Example 11. The avalanche photodiode of Example 10, wherein the APD operates at a temperature greater than 200 K.

Example 12. The avalanche photodiode of Example 1, further comprising a second interfacial charge sublayer adjacent to the intermediate charge sublayer opposite to the first interfacial charge sublayer, the first interfacial charge sublayer having a third thickness and comprising a semiconductor material having a composition comprising $A_x B_{1-x}$.

Example 13. The avalanche photodiode of Example 12, wherein the third thickness is from 10 nm to 200 nm.

Example 14. The avalanche photodiode of Example 12, wherein x has a value from 0.3 to 0.7.

Example 15. The avalanche photodiode of Example 12, wherein the intermediate charge sublayer has a graded energy bandgap.

Example 16. The avalanche photodiode of Example 12, wherein x is substantially equal to w.

Example 17. The avalanche photodiode of Example 12, wherein y is graded from w at an interface between the first interfacial charge sublayer and the intermediate charge sublayer to x at an interface between the intermediate charge sublayer and the second interfacial charge sublayer.

Example 18. The avalanche photodiode of Example 12 wherein at least one layer characteristic is different for the first, second, and second interfacial charge sublayers.

Example 19. The avalanche photodiode of Example 18, wherein the at least one layer characteristic comprises: a material type, a material composition, a rate of change of material composition along a growth direction, an energy bandgap, an energy bandgap variation along a growth direction, a dopant type, or a doping concentration.

Example 20. The avalanche photodiode of Example 12, wherein A is Aluminum and B is Indium and the first interfacial charge sublayer, the intermediate charge sublayer, the second interfacial charge sublayer, and the absorption layer comprise AlInAsSb.

Example 21. The avalanche photodiode of any of Examples 1, 15, and 4, wherein the intermediate charge sublayer is a single layer.

Example 22. The avalanche photodiode of Example 20, wherein the multiplication layer comprises $Al_m In_{1-m} AsSb$ with m=0.5 to 0.9.

Example 23. The avalanche photodiode of Example 1, further comprising:

a substrate layer;

a bottom contact layer extended from the substrate layer to the multiplication layer;

a matching layer adjacent to the absorption layer opposite to the first interfacial charge sublayer;

a blocking layer adjacent to the matching layer opposite to the absorption layer;

a top contact layer adjacent to the blocking layer opposite to the matching layer;

wherein the bottom contact layer is configured to allow charge carrier transport between a first conductive line and the multiplication layer; and wherein the top contact layer is configured to allow charge carrier transport between a second conductive line and the blocking layer.

Example 24. The avalanche photodiode of Example 23, wherein a composition of the matching layer is graded from a composition of the absorption layer at an interface between the matching layer and the absorption layer to a composition of the blocking layer at an interface between the matching layer and the blocking layer.

Example 25. The avalanche photodiode of Example 23, wherein the matching layer comprises a first matching sublayer having a composition of the absorption layer and second matching sublayer having a composition of the blocking layer.

Example 26. The avalanche photodiode of Example 23, wherein the top and bottom contact layers comprise InP or GaSb.

Example 27. The avalanche photodiode of Example 23, wherein the blocking layer and the matching layer comprise AlInAsSb.

Example 28. A light detection and ranging (LIDAR) system comprising:

an emission system configured to generate a light beam; and the avalanche photodiode (APD) of any of the Examples above, wherein the avalanche photodiode is configured to receive a portion of the light beam and generate the photocurrent based at least in part on the light beam.

Example 29. The LIDAR system of Example 28 wherein the portion of the light beam comprises light reflected by an object in an environment monitored by the LIDAR system.

Example 30. The LIDAR system of Example 28, further comprising a detection system configured to receive the photocurrent.

Example 31. The avalanche photodiode of Example 28, wherein the APD is integrated with the LIDAR system.

Example 32. The avalanche photodiode of any of Examples 27-31, wherein the light beam has a wavelength from 2 microns to 4 microns.

Example 33. A night vision system comprising the avalanche photodiode (APD) of any of the Examples above, wherein the APD is configured to receive a thermal emission generated by an object or light reflected by the object and generate the photocurrent based at least in part on the thermal emission or reflected light.

Example 34. The avalanche photodiode of Example 33, wherein the APD is integrated with the night vision system.

Example 35. The avalanche photodiode of Example 33 or 34, wherein the reflected light has a wavelength from 2 microns to 4 microns.

Example 36. A method of converting a beam of light to a photocurrent, the method comprising:

disposing the avalanche photodiode (APD) of any of the Examples 1-27 in an optical path of the beam of light; and receiving the photocurrent generated by the APD in response to the beam of light contacting the APD.

Example 37. The method of Example 36, further comprising biasing the APD using a reverse bias voltage.

Group 3

Example 1. An avalanche photodiode (APD) configured to generate a photocurrent upon receiving light having a wavelength in a mid-IR spectral range, the avalanche photodiode comprising:

a multiplication layer comprising AlInAsSb;

a charge layer comprising:

a first charge sublayer adjacent to the multiplication layer;

a second charge sublayer adjacent to the first charge sublayer opposite to the multiplication layer; and a third charge sublayer adjacent to the second charge sublayer opposite to first charge sublayer; and an absorption layer adjacent to the third charge sublayer, opposite to the second charge sublayer, wherein the absorption layer comprises AlInAsSb;

wherein the first, second, and third charge sublayers comprise AlInAsSb; and wherein at least one layer characteristic is different for the first, second, and third charge sublayers.

Example 2. The avalanche photodiode of Example 1, wherein a stoichiometric ratio between Al and In in the third charge sublayer is greater than a stoichiometric ratio between Al and In in the absorption layer by at least a factor of 3.

Example 3. The avalanche photodiode of Example 1, wherein the at least one layer characteristic comprises: a material type, a material composition, a rate of change of material composition along a growth direction, an energy bandgap, an energy bandgap variation along a growth direction, a dopant type, or a doping concentration.

Example 4. The avalanche photodiode of Example 1, wherein each of the first, second, and third charge sublayers have a different stoichiometric ratio between Al and In.

Example 5. The avalanche photodiode of Example 1, wherein a composition of the second charge sublayer is graded from a composition of the first charge sublayer to the composition of the third charge sublayer.

Example 6. The avalanche photodiode of Example 1, wherein a stoichiometric ratio between Al and In in the third charge sublayer is not greater than a stoichiometric ratio between Al and In in the absorption more than 5 times.

Example 7. The avalanche photodiode of Example 1, wherein the multiplication layer has a composition $Al_m In_{1-m} As_y Sb_{1-y}$, with m=0.5 to m=0.9.

Example 8. The avalanche photodiode of Example 1, wherein the first charge sublayer has a composition $Al_{x1} In_{1-x1} As_y Sb_{1-y}$, with x1=0.3 to x1=0.7.

Example 9. The avalanche photodiode of Example 8, wherein the third charge sublayer has a composition $Al_{x3} In_{1-x3} As_y Sb_{1-y}$, with x3=0.3 to x3=0.6.

Example 10. The avalanche photodiode of Example 8, wherein the second charge sublayer has a composition $Al_{x2} In_{1-2} As_y Sb_{1-y}$, wherein x2 is graded from x3 at an interface between the first charge sublayer and the second charge sublayer to x1 at an interface between the second charge sublayer and the third charge sublayer.

Example 11. The avalanche photodiode of Example 9, wherein the absorption layer has a composition $Al_z In_{1-z} As_y Sb_{1-y}$, with z=0 to z=0.5.

Example 12. The avalanche photodiode of Example 9, wherein a difference between x3 and z is greater than 0.2 but less than 1.

Example 13. The avalanche photodiode of Example 1, wherein a thickness of the multiplication layer is from 100 nanometers to 2000 nanometers.

Example 14. The avalanche photodiode of Example 1, wherein a thickness of the first charge sublayer is from 10 nanometers to 200 nanometers.

Example 15. The avalanche photodiode of Example 1, wherein a thickness of the second charge sublayer is from 10 nanometers to 200 nanometers.

Example 16. The avalanche photodiode of Example 1, wherein a thickness of the third charge sublayer is from 10 nanometers to 200 nanometers.

Example 17. The avalanche photodiode of Example 1, wherein a thickness of the absorption layer is from 100 nanometers to 2000 nanometers.

Example 18. The avalanche photodiode of Example 1, wherein the multiplication layer comprises unintentionally doped n-type AlInAsSb.

Example 19. The avalanche photodiode of Example 1, wherein the charge layer comprises p-type AlInAsSb.

Example 20. The avalanche photodiode of Example 1, wherein the absorption layer comprises p-type AlInAsSb.

Example 21. The avalanche photodiode of Example 1, wherein the absorption layer comprises unintentionally doped n-type AlInAsSb.

Example 22. The avalanche photodiode of Example 1, further comprising a bottom contact layer adjacent to the multiplication layer opposite to the first charge sublayer.

Example 23. The avalanche photodiode of Example 22, wherein the bottom contact layer comprises GaSb or InP.

Example 24. The avalanche photodiode of Example 1, further comprising:

a matching layer adjacent to the absorption layer opposite to the third charge sublayer;

a blocking layer adjacent to the matching layer opposite to the absorption layer;

a top contact layer adjacent to the blocking layer opposite to the matching layer;

wherein the matching layer and the blocking layer comprise AlInAsSb.

Example 25. The avalanche photodiode of Example 24, wherein the matching layer comprises a first matching sublayer having a stoichiometric ratio between Al and In identical to that of the absorption layer and a second matching sublayer having a stoichiometric ratio between Al and In identical to that of the blocking layer.

Example 26. The avalanche photodiode of Example 24, wherein a stoichiometric ratio between Al and In is graded from a first value associated with the absorption layer to a second value associated with the blocking layer.

Example 27. The avalanche photodiode of Example 24, wherein the matching layer has a composition $Al_x In_{1-x} As_y Sb_{1-y}$, with x=0.15 to x=0.7.

Example 28. The avalanche photodiode of Example 24, wherein the blocking layer has a composition $Al_x In_{1-x} As_y Sb_{1-y}$, with x=0.5 to x=0.9.

Example 29. The avalanche photodiode of Example 24, wherein a thickness of the matching layer is from 20 nanometers to 200 nanometers.

Example 30. The avalanche photodiode of Example 24, wherein a thickness of the blocking layer is from 20 nanometers to 200 nanometers.

Example 31. The avalanche photodiode of Example 24, wherein the matching layer comprises p-type AlInAsSb.

Example 32. The avalanche photodiode of Example 24, wherein the blocking layer comprises p-type AlInAsSb.

Example 33. The avalanche photodiode of Example 24, wherein the top contact layer comprises GaSb or InP.

Example 34. The avalanche photodiode of Example 1, wherein the APD is reverse biased, and a single photon photocurrent generated by a photon of the light is greater than a dark current generated by the APD.

Example 35. The avalanche photodiode of Example 33, wherein the APD operates at a temperature greater than 200 K.

Example 36. A light detection and ranging (LIDAR) system comprising:

an emission system configured to generate a light beam; and the avalanche photodiode (APD) of any of the Examples above, wherein the avalanche photodiode is configured to receive a portion of the light beam and generate the photocurrent based at least in part on the light beam.

Example 37. The LIDAR system of Example 36 wherein the portion of the light beam comprises light reflected by an object in an environment monitored by the LIDAR system.

Example 38. The LIDAR system of Example 36, further comprising a detection system configured to receive the photocurrent.

Example 39. The avalanche photodiode of Example 36, wherein the APD is integrated with the LIDAR system.

Example 40. The avalanche photodiode of any of the Examples 36-39, wherein the light beam has a wavelength from 2 microns to 4 microns.

Example 41. A night vision system comprising the avalanche photodiode (APD) of any of the Examples above, wherein the APD is configured to receive a thermal emission generated by an object or light reflected by the object and generate the photocurrent based at least in part on the thermal emission or reflected light.

Example 42. The avalanche photodiode of Example 41, wherein the APD is integrated with the night vision system.

Example 43. The avalanche photodiode of Examples 41 or 42, wherein the reflected light has a wavelength from 2 microns to 4 microns.

Example 44. A method of converting a beam of light to a current, the method comprising:

disposing the avalanche photodiode (APD) of any of the Examples 1-35 in an optical path of the beam of light; and receiving the current generated by the APD in response to the beam of light contacting the APD.

Example 45. The method of Example 44, further comprising biasing the APD using a reverse bias voltage.

Group 4

Example 1. A method of fabricating an avalanche photodiode (APD) configured to allow generation and amplification of a photocurrent upon receiving light while limiting the generation of a dark current, wherein the light comprises incident photons having wavelengths within an operating wavelength range of the APD, the method comprising:

disposing a bottom contact layer above a substrate layer;

disposing a multiplication layer above the bottom contact layer, the multiplication layer comprising AlInAsSb;

disposing a first charge sublayer having a first thickness on top of the multiplication layer;

disposing a second charge sublayer having a second thickness on top of the first charge sublayer;

disposing a third charge sublayer having a third thickness on top of the second charge sublayer; and disposing an absorption layer on top of the third charge sublayer, the absorption layer comprising AlInAsSb;

wherein at least one layer characteristic is different for the first, second, and third charge sublayer.

Example 2. The method of Example 1, wherein at least one of the absorption layer, the charge layer, or the multiplication layer is disposed using molecular beam epitaxy (MBE).

Example 3. The method of Example 1, wherein a stoichiometric ratio between Aluminum (Al) and Indium (In) in the third charge sublayer is greater than a stoichiometric ratio between Al and In in the absorption layer by a factor greater than 3 and smaller than 5.

Example 4. The method of Example 1, wherein the at least one layer characteristic comprises: a material type, a material composition, a rate of change of material composition along a growth direction, an energy bandgap, an energy bandgap variation along a growth direction, a dopant type, or a doping concentration.

Example 5. The method of Example 1, wherein the substrate layer comprises GaSb.

Example 6. The method of Example 5, wherein the substrate layer comprises n-type Tellurium-doped GaSb (001) substrate.

Example 7. The method of Example 1, wherein a stoichiometric ratio between Al and In in the third charge sublayer is greater than a stoichiometric ratio between Al and In in the absorption layer by at least a factor of 3.5.

Example 8. The method of Example 1, wherein the multiplication layer has a composition $Al_mIn_{1-m}As_ySb_{1-y}$, with m=0.5 to m=0.9.

Example 9. The method of Example 8, wherein a background carrier concentration of the multiplication layer has been lowered through outgassing and the multiplication layer comprises a native n-type AlInAsSb.

Example 10. The method of Example 1, wherein the first charge sublayer has a composition $Al_{x1}In_{1-x1}As_ySb_{1-y}$, with x1=0.3 to x1=0.7.

Example 11. The method of Example 10, wherein disposing the first charge sublayer comprises turning off a Beryllium source.

Example 12. The method of Example 11, wherein the second charge sublayer has a composition $Al_{x2}In_{1-x2}As_ySb_{1-y}$, with x2=0.4 to x2=0.7.

Example 13. The avalanche photodiode of Example 12, wherein the third charge sublayer has a composition $Al_{x3}In_{1-x3}As_ySb_{1-y}$, with x3=0.3 to x3=0.6.

Example 14. The avalanche photodiode of Example 13, wherein the absorption layer has a composition $Al_zIn_{1-z}As_ySb_{1-y}$, with z=0 to z=0.5.

Example 15. The method of Example 13, wherein disposing the second charge sublayer comprises grading x2 from x1 to x3 to from the second charge sublayer comprising a graded energy bandgap.

Example 16. The method of Example 14, wherein a difference between x3 and z is greater than 0.2.

Example 17. The method of Example 1, wherein a thickness of the multiplication layer is from 100 nanometers to 2000 nanometers.

Example 18. The method of Example 1, wherein the first thickness is from 10 nanometers to 200 nanometers.

Example 19. The method of Example 1, wherein the second thickness is from 10 nanometers to 200 nanometers.

Example 20. The method of Example 1, wherein the third thickness is from 10 nanometers to 200 nanometers.

Example 21. The avalanche photodiode of Example 1, wherein a thickness of the absorption layer is from 100 nanometers to 2000 nanometers.

Example 22. The method of Example 1, wherein the multiplication layer comprises unintentionally doped n-type AlInAsSb.

Example 23. The method of Example 1, wherein the charge layer comprises p-type AlInAsSb.

Example 24. The method of Example 1, wherein the absorption layer comprises compensated p-type AlInAsSb.

Example 25. The method of Example 1, wherein the bottom contact layer comprises GaSb or InP.

Example 26. The method of Example 1, further comprising:

disposing a matching layer on above the absorption layer;
disposing a blocking layer above the matching layer; and
disposing a top contact layer above the blocking layer;
wherein the matching layer and the blocking layer comprise AlInAsSb.

Example 27. The method of Example 26, wherein disposing the matching layer comprises disposing a first matching sublayer having a stoichiometric ratio between Al and In identical to that of the absorption layer and disposing a second matching sublayer having a stoichiometric ratio between Al and In identical to that of the blocking layer.

Example 28. The method of Example 26, wherein disposing the matching layer comprises grading a stoichiometric ratio between Al and In from a first value associated with the absorption layer to a second value associated with the blocking layer.

Example 29. The method of Example 26, wherein the matching layer has a composition $Al_xIn_{1-x} As_ySb_{1-y}$, with x=0.15 to x=0.7.

Example 30. The method of Example 26, wherein the blocking layer has a composition $Al_xIn_{1-x} As_ySb_{1-y}$, with x=0.5 to x=0.9.

Example 31. The method of Example 26, wherein a thickness of the matching layer is from 20 nanometers to 200 nanometers.

Example 32. The method of Example 26, wherein a thickness of the blocking layer is from 20 nanometers to 200 nanometers.

Example 33. The method of Example 26, wherein the matching layer and the blocking layer comprise p-type AlInAsSb.

Example 34. The method of Example 26, wherein the second contact layer comprises GaSb or InP.

Example 35. The method of Example 26, further comprising forming a mesa by at least:

partially etching the mesa using reactive ion etching; fully etching the mesa down to the bottom of the bottom contact layer using wet etching;
passivating the APD; and
depositing a conductive line.

Example 36. The method of Example 35. wherein the wet etching comprises etching using citric/phosphoric acid solution.

Example 37. The method of Example 35, wherein the conductive line comprises Titanium (Ti) or gold (Au).

Terminology

The information presented here in detail is meant to exemplify several embodiments of the invention, rather than to limit it. The specific configurations and operations explained can vary, and the methods and apparatuses discussed can be applied in many contexts. There is potential for modification: components can be added, removed, or rearranged, and steps can be added, removed, or reordered. This allows for a wide range of designs and approaches.

Any modifications to the implementations described here can easily be understood and applied by those skilled in the art. The principles defined can be implemented in other contexts without deviating from the spirit or scope of this disclosure. Therefore, the claims should be interpreted broadly, and not limited to the specific implementations shown.

The term "exemplary" is used strictly to mean "serving as an example, instance, or illustration." No implementation described as "exemplary" should be considered as preferred or advantageous over others. The terms "upper" and "lower" are used for descriptive ease and indicate relative positions, not the device's orientation.

This disclosure can be implemented in a variety of opto-electronic, optical, and quantum devices and systems such as, but not limited to, night vision systems, lidars, lasers, optical communication systems, medical imaging systems, biosensors, gas sensors, medical diagnostic devices and systems, quantum communication systems, quantum computing systems, quantum sensors, etc.

Words like "comprise," "comprising," "include," "including" and the like are used inclusively, that is, "including, but not limited to." The word "coupled" and "connected" generally refers to elements that are directly connected or connected via one or more intermediate elements.

Features described in separate implementations can also be combined in a single implementation. Conversely, features described in a single implementation can be implemented separately or in any suitable subcombination. Despite initial claims, one or more features from a claimed combination can be excised, redirecting the claim to a subcombination or variation of a sub combination.

Not all objects or advantages may be achieved with any particular embodiment. For example, certain embodiments may optimize one advantage or group of advantages without necessarily achieving others.

Language like "can," "could," "might" or "may" are used to convey that certain embodiments include specific features, elements and/or steps, while others do not. The phrase "at least one of X, Y, or Z" means an item may be either X, Y, or Z, or any combination thereof.

Unless otherwise stated, articles like "a" or "an" should generally be interpreted to include one or more described items. For example, "a processor configured to carry out recitations A, B and C" can include two processors working together to carry out these recitations.

The term "adjacent" refers to layers or regions of materials that are immediately next to each other or separated by one or more intervening layers.

The above description provides various embodiments, but the scope of this disclosure includes numerous variations and modifications. All are intended to be included here.

What is claimed is:

1. An avalanche photodiode (APD) configured to allow generation and amplification of a photocurrent upon receiving light while limiting the generation of a dark current, wherein the light comprises incident photons having wavelengths within an operating wavelength range of the APD, the APD comprising:

an absorption layer configured to absorb the incident photons, the absorption layer comprising a first semiconductor material having a first energy bandgap;

a multiplication layer configured to allow multiplication of charge carriers generated in the absorption layer, the multiplication layer comprising a second semiconductor material having a second energy bandgap; and a charge layer disposed between the multiplication layer and the absorption layer, wherein the charge layer comprises:

a first interfacial charge sublayer adjacent to the absorption layer, the first interfacial charge sublayer having a first thickness and comprising a third semiconductor material having a third energy bandgap; and an intermediate charge sublayer adjacent to the first interfacial charge sublayer opposite to the absorption layer, the intermediate charge sublayer having a second thickness and comprising a fourth semiconductor material having a fourth energy bandgap;

wherein the third energy bandgap is greater than the first energy bandgap by a factor greater than 1.2 at least at an interface between the first interfacial charge sublayer and the absorption layer.

2. The avalanche photodiode of claim 1, further comprising a second interfacial charge sublayer adjacent to the intermediate charge sublayer opposite to the first interfacial charge sublayer, the second interfacial charge sublayer having a third thickness and comprising a fifth semiconductor material having a fifth energy bandgap different from the third energy bandgap.

3. The avalanche photodiode of claim 2, wherein the third thickness is from 10 nm to 200 nm.

4. The avalanche photodiode of claim 2, wherein the fourth energy bandgap is graded along the second thickness.

5. The avalanche photodiode of claim 4, wherein the fourth energy bandgap is graded from the third energy bandgap to the fifth energy bandgap.

6. The avalanche photodiode of claim 4, wherein the intermediate charge sublayer is a single layer.

7. The avalanche photodiode of claim 2, wherein a composition of the fourth semiconductor material is graded from a composition of the third semiconductor material at an interface between the first interfacial charge sublayer and the intermediate charge sublayer to a composition of the fifth semiconductor material at an interface between the intermediate charge sublayer and the second interfacial charge sublayer.

8. The avalanche photodiode of claim 2, wherein the fifth energy bandgap is substantially equal to the second energy bandgap at least at an interface between the multiplication layer and the second interfacial charge sublayer.

9. The avalanche photodiode of claim 2, wherein the third and fifth semiconductor materials comprise the same elements, and wherein each of the third and fifth semiconductor materials has different stoichiometric ratios between at least two elements.

10. The avalanche photodiode of claim 2, wherein the first, second, third, fourth, and fifth semiconductor materials comprise p-type AlInAsSb.

11. The avalanche photodiode of claim 2, wherein the first, second, third, fourth, and fifth semiconductor materials comprise AlInAsSb.

12. The avalanche photodiode of claim 11, wherein the first semiconductor material has a composition of $Al_zIn_{1-z}$ AsSb with z=0 to 0.5.

13. The avalanche photodiode of claim 11, wherein the second semiconductor material has a composition of $Al_mIn_{1-m}$ AsSb with m=0.5 to 0.9.

14. The avalanche photodiode of claim 11, wherein the third semiconductor material has a composition of $Al_wIn_{1-w}$ AsSb with w=0.3 to 0.6.

15. The avalanche photodiode of claim 14, wherein the fifth semiconductor material has a composition of $Al_xIn_{1-x}$ AsSb with x=0.3 to 0.7.

16. The avalanche photodiode of claim 15, wherein the fourth semiconductor material has a composition of $Al_yIn_{1-y}$ AsSb, and wherein y is graded from w from an interface between the first interfacial charge sublayer and the intermediate charge sublayer to x at an interface between the intermediate charge sublayer and the second interfacial charge sublayer.

17. The avalanche photodiode of claim 1, wherein a ratio between the third energy bandgap and the first energy bandgap is smaller than 3.

18. The avalanche photodiode of claim 1, wherein the first thickness is from 10 nm to 200 nm.

19. The avalanche photodiode of claim 1, wherein the second thickness is from 10 nm to 200 nm.

20. The avalanche photodiode of claim 1, wherein the operating wavelength range of the APD is within a mid-infrared spectral range.

21. The avalanche photodiode of claim 20, wherein the operating wavelength range is from 2 microns to 6 microns.

22. The avalanche photodiode of claim 20, wherein the APD is reverse biased, and a single photon photocurrent generated by a photon of the incident photons is greater than the dark current.

23. The avalanche photodiode of claim 22, wherein the APD operates at a temperature greater than 200 K.

24. The avalanche photodiode of claim 1, further comprising:

a substrate layer;

a bottom contact layer extended from the substrate layer to the multiplication layer;

a matching layer adjacent to the absorption layer opposite to the first interfacial charge sublayer;

a blocking layer adjacent to the matching layer opposite to the absorption layer; and a top contact layer adjacent to the blocking layer opposite to the matching layer;

wherein the bottom contact layer is configured to allow charge carrier transport between a bottom conductive line and the multiplication layer; and wherein the top contact layer is configured to allow charge carrier transport between a top conductive line and the blocking layer.

25. The avalanche photodiode of claim 24, wherein a composition of the matching layer is graded from a composition of the absorption layer at an interface between the matching layer and the absorption layer to a composition of the blocking layer at an interface between the matching layer and the blocking layer.

26. The avalanche photodiode of claim 24, wherein the matching layer comprises a first matching sublayer having a composition of the absorption layer and second matching sublayer having a composition of the blocking layer.

27. The avalanche photodiode of claim 24, wherein the top and bottom contact layers comprise InP or GaSb.

28. The avalanche photodiode of claim 24, wherein the blocking layer and the matching layer comprise AlInAsSb.

* * * * *